(12) United States Patent
Kagawa

(10) Patent No.: US 10,062,477 B1
(45) Date of Patent: Aug. 28, 2018

(54) ELECTROMAGNETIC-WAVE-ABSORBING FILTER

(71) Applicants: Seiji Kagawa, Koshigaya-shi, Saitama (JP); Atsuko Kagawa, Koshigaya-shi, Saitama (JP)

(72) Inventor: Seiji Kagawa, Koshigaya (JP)

(73) Assignees: Seiji Kagawa, Koshigaya-shi (JP); Atsuko Kagawa, Koshigaya-shi (JP)

( * ) Notice: Subject to any disclaimer, the term of this patent is extended or adjusted under 35 U.S.C. 154(b) by 0 days.

(21) Appl. No.: 15/887,017

(22) Filed: Feb. 2, 2018

(30) Foreign Application Priority Data

May 23, 2017 (JP) ................................ 2017-102108

(51) Int. Cl.
   *H05K 9/00* (2006.01)
   *H01B 11/10* (2006.01)
   *H01B 3/02* (2006.01)
   *H01B 3/30* (2006.01)

(52) U.S. Cl.
   CPC ............. *H01B 11/105* (2013.01); *H01B 3/02* (2013.01); *H01B 3/30* (2013.01); *H05K 9/0064* (2013.01); *H05K 9/0081* (2013.01); *H05K 9/0086* (2013.01); *H05K 9/0088* (2013.01); *H05K 9/0098* (2013.01)

(58) Field of Classification Search
   CPC ... H05K 9/0086; H05K 9/0088; H05K 9/0098
   See application file for complete search history.

(56) References Cited

U.S. PATENT DOCUMENTS

| 8,598,470 | B2 * | 12/2013 | Kagawa | .................... B32B 3/30 |
| | | | | 174/386 |
| 9,326,433 | B2 * | 4/2016 | Kagawa | ............... H05K 9/0086 |
| 9,616,640 | B2 * | 4/2017 | Kagawa | .................. B32B 15/08 |
| 9,894,817 | B2 * | 2/2018 | Kagawa | ............... H05K 9/0088 |
| 2005/0233102 | A1 * | 10/2005 | Kagawa | .................. B29C 59/04 |
| | | | | 428/43 |
| 2009/0075068 | A1 | 3/2009 | Pyo et al. | |

FOREIGN PATENT DOCUMENTS

| JP | 11-185542 A | 7/1999 |
| JP | 2005-259385 A | 9/2005 |
| JP | 2009-71266 A | 4/2009 |

* cited by examiner

*Primary Examiner* — Hung V Ngo
(74) *Attorney, Agent, or Firm* — Birch, Stewart, Kolasch & Birch, LLP

(57) ABSTRACT

An electromagnetic-wave-absorbing filter comprising an electromagnetic-wave-absorbing layer, an insulating layer, and an electromagnetic-wave-shielding layer in this order from inside; the electromagnetic-wave-absorbing layer being constituted by a laminate of at least two electromagnetic-wave-absorbing films; each electromagnetic-wave-absorbing film comprising a plastic film and a thin metal film formed on a surface of the plastic film, the thin metal film being provided with large numbers of linear scratches in plural directions; the acute crossing angle θs of linear scratches in each electromagnetic-wave-absorbing film being 30-90°; the linear scratches in two electromagnetic-wave-absorbing films being crossing; two electromagnetic-wave-absorbing films having different lengths; and a ratio of the length $L_2$ of a shorter electromagnetic-wave-absorbing film to the length $L_1$ of a longer electromagnetic-wave-absorbing film being 30-70%.

10 Claims, 33 Drawing Sheets

Londitudinal Direction of Cable

ELECTROMAGNETIC-WAVE-ABSORBING FILTER

FIELD OF THE INVENTION

The present invention relates to an electromagnetic-wave-absorbing filter having high electromagnetic wave absorbability, which is wound around a conductor cable.

BACKGROUND OF THE INVENTION

Electromagnetic waves are radiated from cables of electric appliances and electronic appliances, and ambient electromagnetic waves intrude into cables, so that noises enter signals. To prevent the radiation and intrusion of electromagnetic waves to and from cables, cables are conventionally shielded with metal nets or foils. For example, JP 11-185542 A discloses a cable having a thin magnetic shield film, which comprises an insulating tape wound around pluralities of signal-transmitting cables, a laminate tape of a high-conductivity metal foil (copper foil, etc.) and a thin film of a high-permeability material (permalloy, etc.) wound around the insulating tape, and an insulator wound around the laminate tape. However, it fails to achieve complete shielding for high-frequency noises. Accordingly, it is proposed to prevent the radiation and intrusion of electromagnetic waves by absorption instead of shielding.

JP 2005-259385 A discloses a communications cable comprising pluralities of first pair-core cables each comprising two metal core cables electrically insulated with a rubber sheath, a first sheath covering the first pair-core cables, pluralities of second pair-core cables each comprising two metal core cables electrically insulated with a rubber sheath and arranged outside the first sheath, a second sheath covering the second pair-core cables, a metal net covering the second sheath, and an insulator layer covering the metal net. Each of the first and second sheaths has a two-layer structure comprising a magnetic layer and a conductor layer. The magnetic layer is formed by, for example, a sheet comprising fine amorphous alloy particles bonded by a binder, and the conductor layer is formed by, for example, a sheet comprising fine silver particles bonded by a binder. However, because the sheath having a two-layer structure comprising a magnetic layer and a conductor layer is used in this communications cable, the cable is inevitably thick and expensive.

JP 2009-71266 A discloses a communications cable having a structure comprising a communications core cable or power core cable covered with an insulating layer, an electromagnetic-wave-absorbing/shielding film comprising an electromagnetic-wave-shielding layer and an electromagnetic-wave-absorbing layer being wound around the cable in the insulating layer. As the electromagnetic-wave-shielding layer, an electromagnetic-wave-shielding film having a thickness of 17-70 μm, which is constituted by a polymer film laminated with an aluminum or copper foil or vapor-deposited with Al or Cu, is exemplified. As the electromagnetic-wave-absorbing layer, an electromagnetic-wave-absorbing film having a thickness of 10-100 μm, which is coated with a paint containing metal flake and/or electromagnetic-wave-absorbing Fe—Si alloy powder, Fe—Si—Cr alloy powder, amorphous metal powder, etc., is exemplified. However, because the electromagnetic-wave-absorbing/shielding film has a two-layer structure comprising the electromagnetic-wave-shielding layer and the electromagnetic-wave-absorbing layer both relatively thick, the communications cable is inevitably thick and expensive.

In place of electromagnetic-wave-absorbing layers entirely covering cables as described above, filters covering part of cables for absorbing electromagnetic waves generated from cables and preventing external noises from intruding into cables are also used. Most of conventional electromagnetic-wave-absorbing filters are formed by sintered ferrite or resin/rubber sheets containing sintered ferrite powder. However, such electromagnetic-wave-absorbing filters are disadvantageously bulky, because of their large thickness.

OBJECT OF THE INVENTION

Accordingly, an object of the present invention is to provide a thin electromagnetic-wave-absorbing filter wound around a communications cable or a power cable, which can effectively suppress the radiation and intrusion of electromagnetic waves to and from the cable.

DISCLOSURE OF THE INVENTION

As a result of intensive research in view of the above object, the inventor has found that an electromagnetic-wave-absorbing filter wound around a communications cable or a power cable (hereinafter referred to simply as "conductor cable"), which has a structure comprising an electromagnetic-wave-absorbing layer, an insulating layer, and an electromagnetic-wave-shielding layer in this order from inside, can effectively suppress the radiation and intrusion of electromagnetic waves to and from the conductor cable, when (a) the electromagnetic-wave-absorbing layer is constituted by two electromagnetic-wave-absorbing films (each having a single- or multi-layer thin metal film formed on a surface of plastic film, the thin metal film being provided with large numbers of substantially parallel, intermittent, linear scratches with irregular widths and intervals in plural directions) having different lengths in a longitudinal direction of the conductor cable; and when (b) the electromagnetic-wave-absorbing films are laminated with their linear scratches crossing. The present invention has been completed based on such findings.

Thus, the electromagnetic-wave-absorbing filter of the present invention to be wound around a conductor cable comprises an electromagnetic-wave-absorbing layer, an insulating layer, and an electromagnetic-wave-shielding layer in this order from inside;

the electromagnetic-wave-absorbing layer being constituted by a laminate of at least two electromagnetic-wave-absorbing films;

each of the electromagnetic-wave-absorbing films comprising a single- or multi-layer thin metal film formed on a surface of a plastic film, the thin metal film being provided with large numbers (pluralities) of substantially parallel, intermittent, linear scratches with irregular widths and intervals in plural directions;

the linear scratches in each of the electromagnetic-wave-absorbing films having an acute crossing angle θs of 30-90°;

the linear scratches in one electromagnetic-wave-absorbing film being crossing the linear scratches in the other electromagnetic-wave-absorbing film;

the two electromagnetic-wave-absorbing films having different lengths in a longitudinal direction of the conductor cable; and an $L_2/L_1$ ratio, wherein $L_1$ is the length of a longer electromagnetic-wave-absorbing film, and $L_2$ is the length of a shorter electromagnetic-wave-absorbing film, being 30-70%.

The minimum crossing angle α between the linear scratches in one electromagnetic-wave-absorbing film and the linear scratches in the other electromagnetic-wave-absorbing film is preferably 10-45°.

In each of the electromagnetic-wave-absorbing films, the linear scratches preferably have widths in a range of 0.1-100 μm for 90% or more and 1-50 μm on average, and the lateral intervals of the linear scratches are preferably in a range of 1-500 μm, and 10-100 μm on average.

The insulating layer is preferably made of a thermoplastic resin or rubber. The insulating layer may contain magnetic particles.

The insulating layer is as thick as preferably 0.5 mm or more, more preferably 1 mm or more.

The electromagnetic-wave-shielding layer is preferably constituted by a plastic film and a single- or multi-layer thin metal film formed on a surface of the plastic film. The thin metal film is preferably made of at least one metal selected from the group consisting of aluminum, copper, silver, tin, nickel, cobalt, chromium and their alloys. The thin metal film is preferably vapor-deposited.

A ground line is preferably attached to the electromagnetic-wave-shielding layer.

DESCRIPTION OF THE PREFERRED EMBODIMENTS

The embodiments of the present invention will be explained in detail referring to the attached drawings, and it should be noted that explanations concerning one embodiment are applicable to other embodiments unless otherwise mentioned. Also, the following explanations are not restrictive, and various modifications may be made within the scope of the present invention.

[1] Structure of Electromagnetic-Wave-Absorbing Filter

Figure 1:
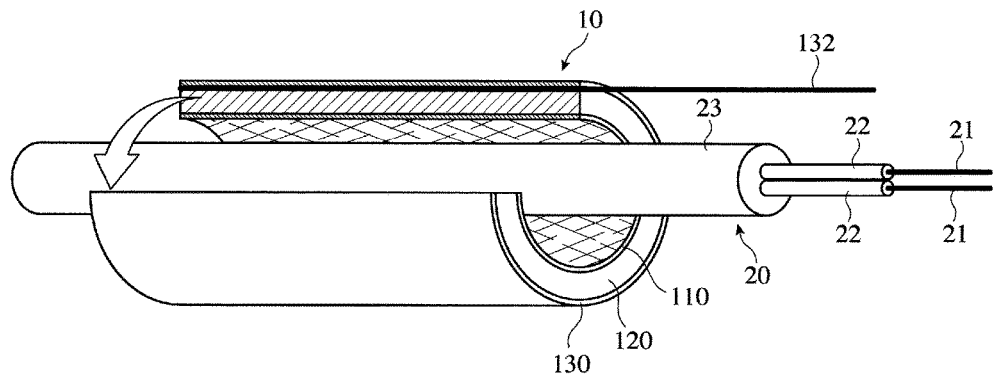
FIG. 1 is a partial perspective development view showing the electromagnetic-wave-absorbing filter of the present invention wound around a conductor cable.
Figure 2:
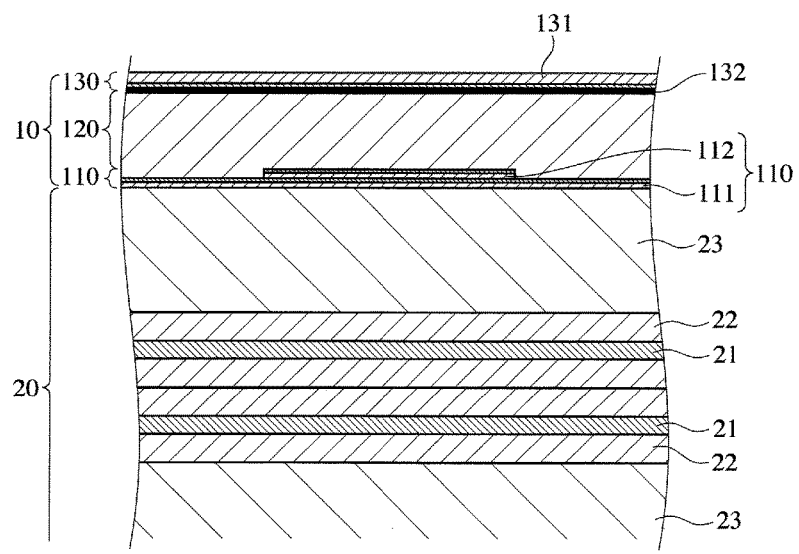
FIG. 2 is a partial cross-sectional view showing the electromagnetic-wave-absorbing filter of the present invention wound around a conductor cable.
Figure 3:
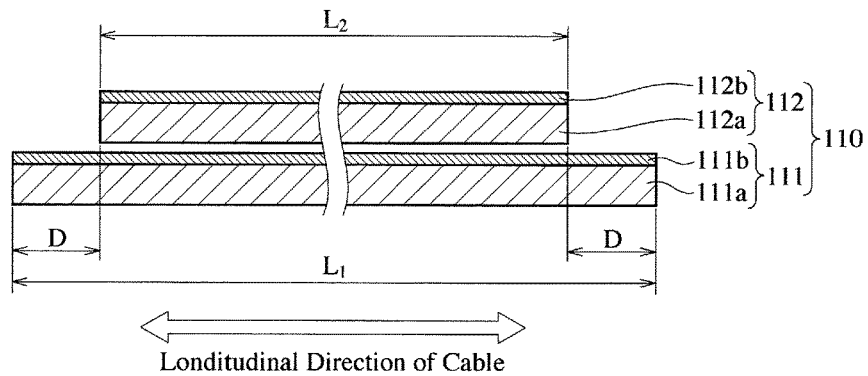
FIG. 3 is a partial cross-sectional view showing the lengths of two electromagnetic-wave-absorbing films.

FIG. 1 shows the internal structure of the electromagnetic-wave-absorbing filter 10 of the present invention, which is wound around a conductor cable 20. The electromagnetic-wave-absorbing filter 10 comprises an electromagnetic-wave-absorbing layer 110, an insulating layer 120, and an electromagnetic-wave-shielding layer 130 in this order from inside. As shown in FIGS. 2 and 3, the electromagnetic-wave-absorbing layer 110 is constituted by a laminate of at least two electromagnetic-wave-absorbing films 111, 112. In each electromagnetic-wave-absorbing film 111, 112, a single- or multi-layer thin metal film 111b, 112b formed on a surface of a plastic film 111a, 112a is provided with large numbers (pluralities) of substantially parallel, intermittent, linear scratches 113 with irregular widths and intervals in plural directions. Two electromagnetic-wave-absorbing films 111, 112 are preferably laminated with the thin metal films 111b, 112b on the same side to the plastic films 111a, 112a (the thin metal film 111b of the electromagnetic-wave-absorbing film 111 is in contact with the plastic film 112a of the electromagnetic-wave-absorbing film 112). In the depicted example, the conductor cable 20 comprises a pair of conductive core cables 21, 21, an insulating inner sheath 22 covering each conductive core cable 21, and an insulating outer sheath 23 covering the insulating inner sheaths 22, 22. This conductor cable 20 is suitable as a signal-transmitting cable, etc., though not restrictive.

Figure 5A:
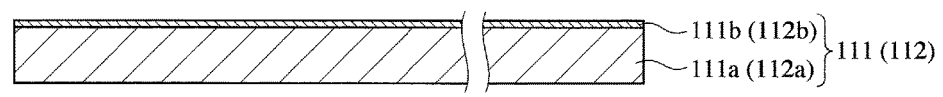
FIG. 5(a) is a cross-sectional view showing an example of the electromagnetic-wave-absorbing films.
Figure 5B:
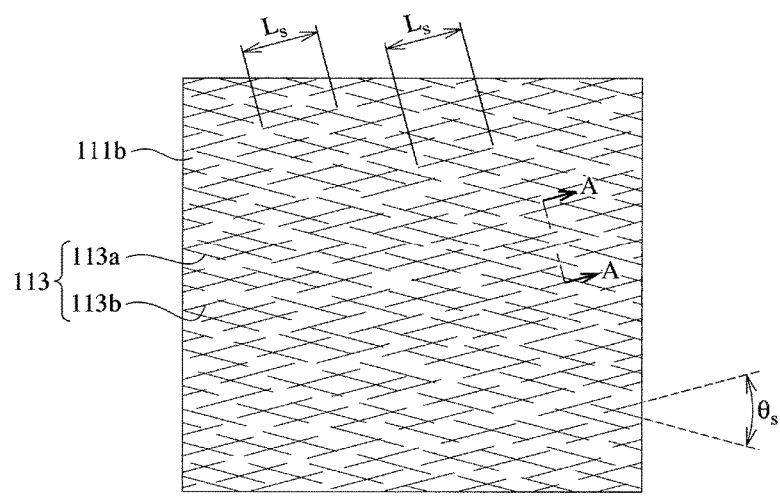
FIG. 5(b) is a partial plan view showing an example of linear scratches in the electromagnetic-wave-absorbing film.

[2] Constituents of Electromagnetic-Wave-Absorbing Filter (1) Electromagnetic-Wave-Absorbing Film As shown in FIGS. 5(a) and 5(b), the electromagnetic-wave-absorbing film 111 (112) comprises a plastic film 111a (112a), and a single- or multi-layer thin metal film 111b (112b) formed on at least one surface of the plastic film 111a (112a), the thin metal film 111b (112b) being provided with large numbers of substantially parallel, intermittent, linear scratches 113 with irregular widths and intervals in plural directions. Because two electromagnetic-wave-absorbing films 111, 112 are not different with respect to constituents, which are a plastic film 111a (112a), a thin metal film 111b (112b) and linear scratches 113, explanations will be made only on the electromagnetic-wave-absorbing film 111. Of course, the explanations of the electromagnetic-wave-absorbing film 111 are applicable to the electromagnetic-wave-absorbing film 112, as they are.

(a) Plastic Film

Resins forming the plastic film 111a are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. From the aspect of strength and cost, polyethylene terephthalate (PET) is preferable. The thickness of the plastic film 111a may be about 8-30 μm.

(b) Thin Metal Film

Metals forming the thin metal film 111b are not particularly restrictive as long as they have conductivity, and they are preferably aluminum, copper, silver, tin, nickel, cobalt, chromium and their alloys, particularly aluminum, copper, nickel and their alloys from the aspect of corrosion resistance and cost. The thickness of the thin metal film 111b is preferably 0.01 μm or more. Though not restrictive, the upper limit of the thickness of the thin metal film 111b may be practically about 10 μm. Of course, the thin metal film 111b may be thicker than 10 μm, with substantially no change in the absorbability of high-frequency electromagnetic waves. Accordingly, the thickness of the thin metal film 111b is preferably 0.01-10 μm, more preferably 0.01-5 μm, most preferably 0.01-1 μm. The thin metal film 111b can be produced by vapor deposition methods (physical vapor deposition methods such as a vacuum vapor deposition method, a sputtering method and an ion plating method, or chemical vapor deposition methods such as a plasma CVD method, a thermal CVD method and a photo CVD method), plating methods, or foil-bonding methods.

When the thin metal film 111b has a single-layer structure, the thin metal film 111b is preferably made of aluminum or nickel from the aspect of conductivity, corrosion resistance and cost. When the thin metal film 111b has a multi-layer structure, one layer may be made of a non-magnetic metal, while the other layer may be made of a magnetic metal. The non-magnetic metals include aluminum, copper, silver, tin and their alloys, and the magnetic metals include nickel, cobalt, chromium and their alloys. The magnetic thin metal film is preferably as thick as 0.01 μm or more, and the non-magnetic thin metal film is preferably as thick as 0.1 μm or more. Though not restrictive, the upper limits of their thicknesses may be practically about 10 μm. More preferably, the thickness of the magnetic thin metal film is 0.01-5 μm, and the thickness of the non-magnetic thin metal film is 0.1-5 μm. FIGS. 5(e) and 5(f) show two layers (thin metal films $111b_1$, $111b_2$) formed on a plastic film 111a.

(c) Linear Scratches

Figure 5C:
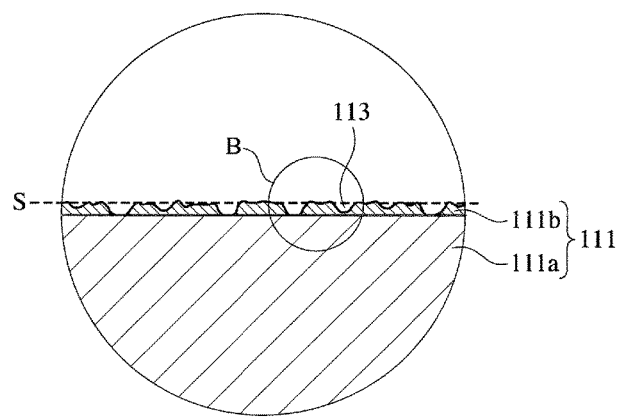
FIG. 5(c) is a cross-sectional view taken along the line A-A in FIG. 5(b).
Figure 5D:
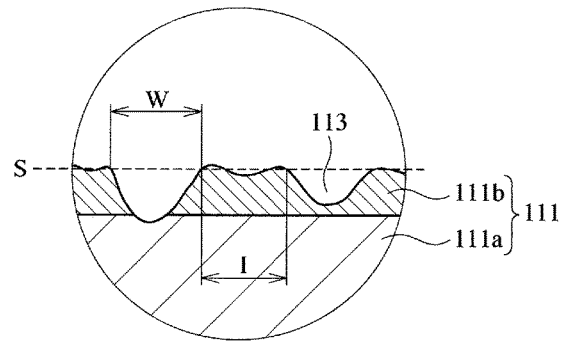
FIG. 5(d) is an enlarged cross-sectional view showing a portion B in FIG. 5(c).
Figure 5E:
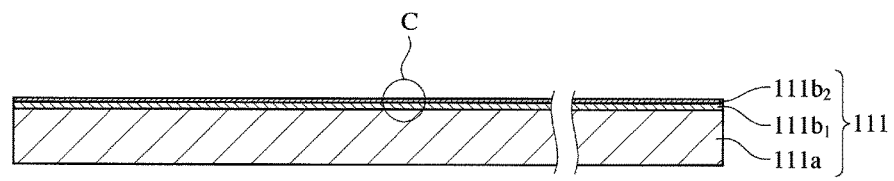
FIG. 5(e) is a cross-sectional view showing another example of the electromagnetic-wave-absorbing films.
Figure 5F:
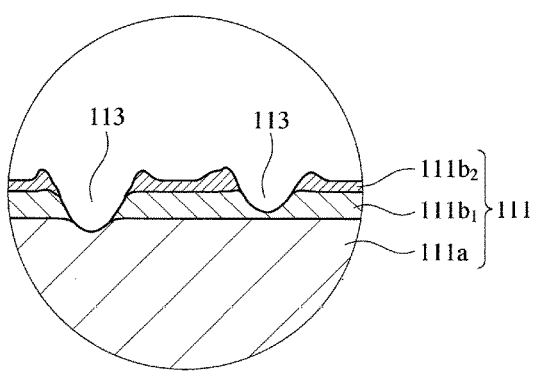
FIG. 5(f) is an enlarged cross-sectional view showing a portion C in FIG. 5(e).

In the example shown in FIGS. 5(b) and 5(c), a thin metal film 111b is provided with large numbers of substantially parallel, intermittent, linear scratches 113a, 113b with irregular widths and intervals in two directions. The depth of linear scratches 113 is exaggerated in FIG. 5(c) for the purpose of explanation. As shown in FIG. 5(d), the linear scratches 113 oriented in two directions have various widths W and intervals I. The widths W and intervals I of the linear scratches 113 are determined at a height corresponding to the surface S of the thin metal film 111b before forming linear scratches. Because the linear scratches 113 have various widths W and intervals I, the electromagnetic-wave-absorbing film 111 can efficiently absorb electromagnetic waves in a wide frequency range.

90% or more of the widths W of the linear scratches 113 are in a range of preferably 0.1-100 μm, more preferably 0.5-50 μm, most preferably 0.5-20 μm. The average width Wav of the linear scratches 113 is preferably 1-50 μm, more preferably 1-10 μm, most preferably 1-5 μm.

The lateral intervals I of the linear scratches 113 are in a range of preferably 1-500 μm, more preferably 1-100 μm, most preferably 1-50 μm, particularly 1-30 μm. The average lateral interval Iav of the linear scratches 113 is preferably 10-100 μm, more preferably 10-50 μm, most preferably 10-30 μm.

Because the lengths Ls of the linear scratches 113 are determined by sliding conditions (mainly relative peripheral speeds of the pattern roll and film, and the winding angle of the film to the pattern roll), most linear scratches 113 have substantially the same lengths Ls (substantially equal to the average length Lsav), unless the sliding conditions are changed. The lengths Ls of the linear scratches 113 may be practically about 1-100 mm, preferably 2-10 mm, though not particularly restrictive.

The acute crossing angle θs, which may be simply called "crossing angle θs" unless otherwise mentioned, of the linear scratches 113a, 113b is preferably 30-90°, more preferably 60-90°. By adjusting the sliding conditions of the composite film to the pattern rolls (sliding directions, relative peripheral speeds, etc.), the linear scratches 113 having various crossing angles θs can be obtained. The linear scratches 113 on two electromagnetic-wave-absorbing films 111, 112 may have the same or different crossing angles $θs_1$, $θs_2$ (see FIG. 10).

(e) Production Method

FIGS. 6(a)-6(e) show an example of apparatuses for forming linear scratches in two directions. This apparatus comprises (a) a reel 221 from which a composite film 200 having a thin metal film on a plastic film is unwound; (b) a first pattern roll 202a arranged in a different direction from the lateral direction of the composite film 200 on the side of the thin metal film 111b; (c) a first push roll 203a arranged upstream of the first pattern roll 202a on the opposite side to the thin metal film 111b; (d) a second pattern roll 202b arranged in an opposite direction to the first pattern roll 202a with respect to the lateral direction of the composite film 200 on the side of the thin metal film 111b; (e) a second push roll 203b arranged downstream of the second pattern roll 202b on the opposite side to the thin metal film 111b; (f) a first electric-resistance-measuring means 204a arranged on the side of the thin metal film 111b between the first and second pattern rolls 202a, 202b; (g) a second electric-resistance-measuring means 204b arranged downstream of the second pattern roll 202b on the side of the thin metal film 111b; and (h) a reel 224, around which a linearly-scratched composite film (electromagnetic-wave-absorbing film) 111 is wound, in this order from upstream. In addition, pluralities of guide rolls 222, 223 are arranged at predetermined positions. Each pattern roll 202a, 202b is rotatably supported by a frame (not shown) of the apparatus, and rotated by a motor (not shown). To prevent bending, each pattern roll 202a, 202b is pushed by a backup roll (for example, rubber roll) 205a, 205b rotatably supported by the frame (not shown) of the apparatus.

Figure 6A:
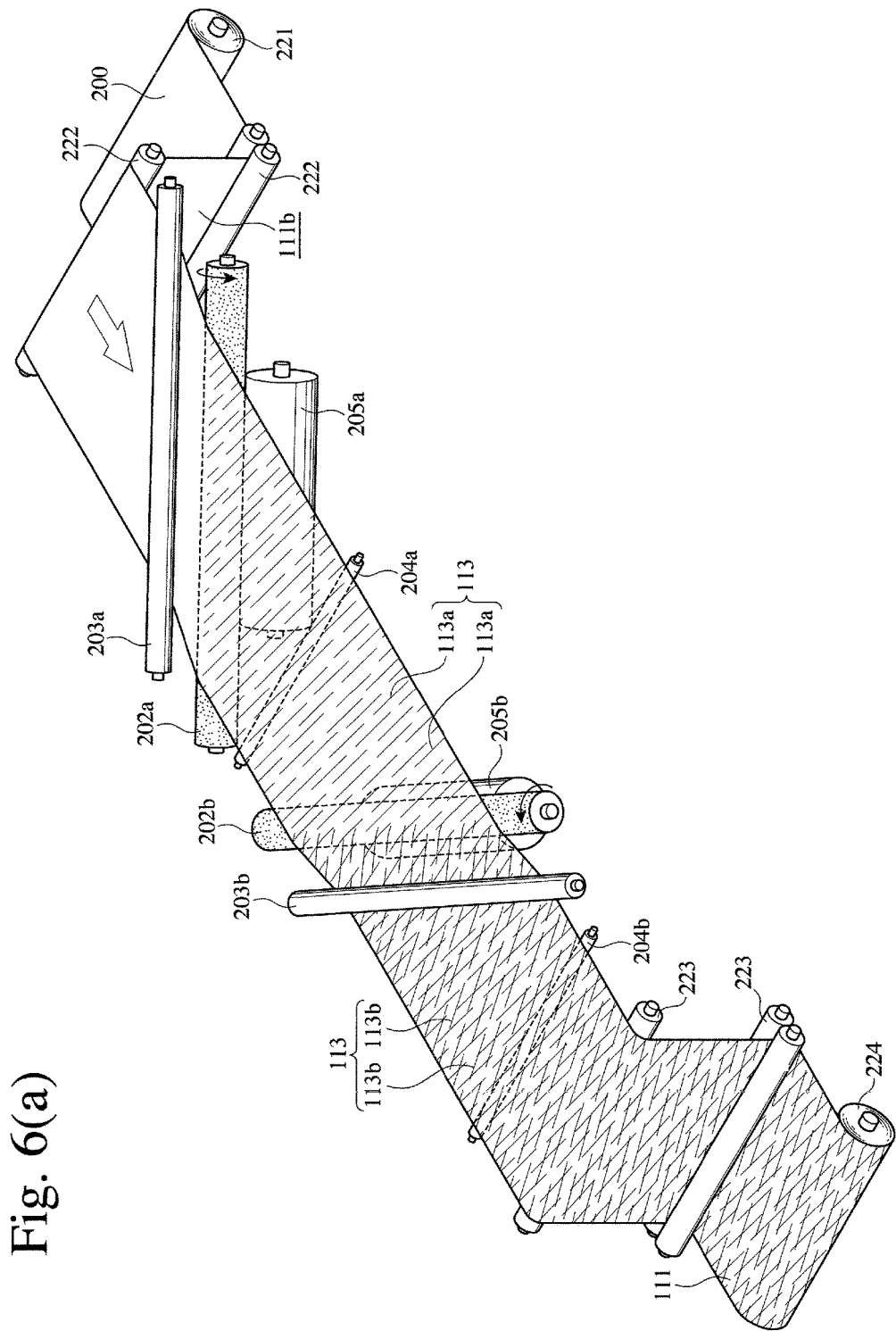
FIG. 6(a) is a perspective view showing an example of the apparatuses for forming linear scratches.
Figure 6B:
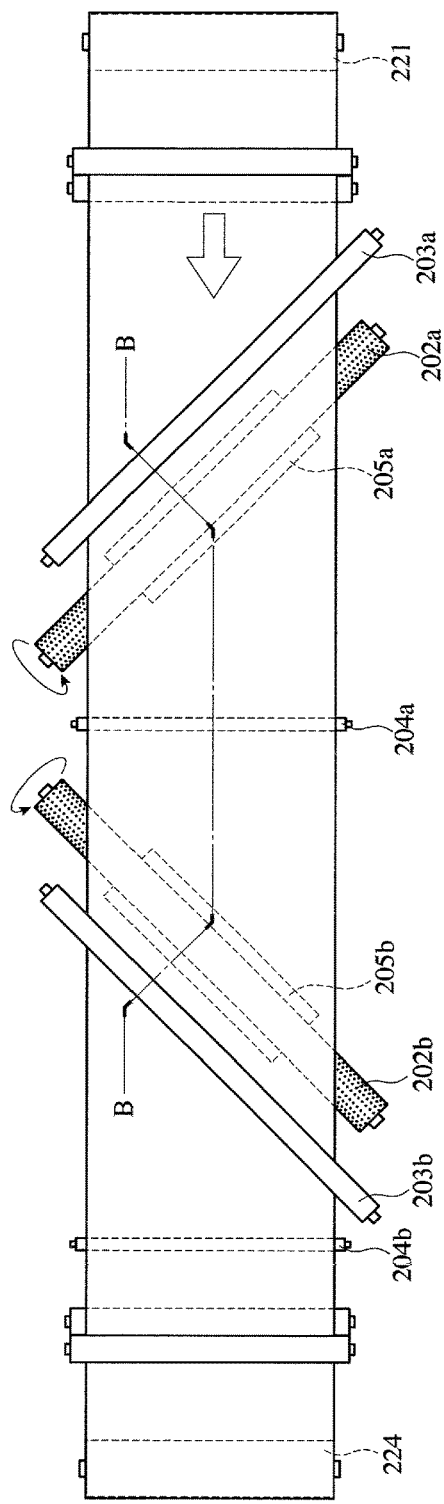
FIG. 6(b) is a plan view showing the apparatus of FIG. 6(a).
Figure 6C:
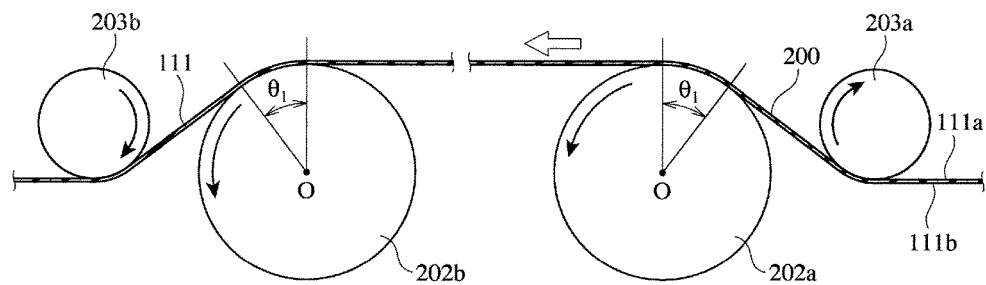
FIG. 6(c) is a cross-sectional view taken along the line B-B in FIG. 6(b).

Because the position of each push roll 203a, 203b is lower than a position at which the composite film 200 is brought into sliding contact with each pattern roll 202a, 202b as shown in FIG. 6(c), the thin metal film 111b of the composite film 200 is pushed to each pattern roll 202a, 202b. With this condition met, the vertical position of each push roll 203a, 203b may be adjusted to control the pressing power of each pattern roll 202a, 202b to the thin metal film 111b, and a sliding distance represented by a center angle $θ_1$.

Figure 6D:
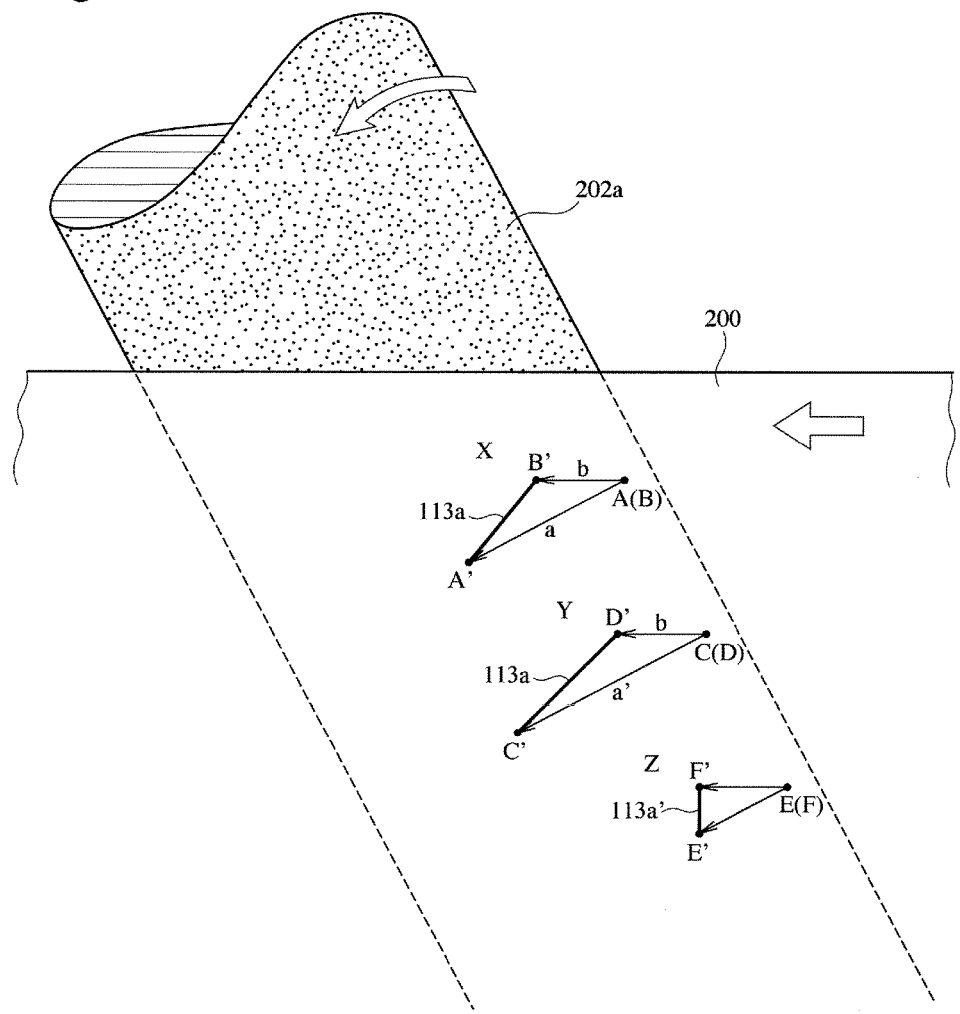
FIG. 6(d) is a partial, enlarged plan view for explaining the principle of forming linear scratches inclined relative to the moving direction of a composite film.
Figure 6E:
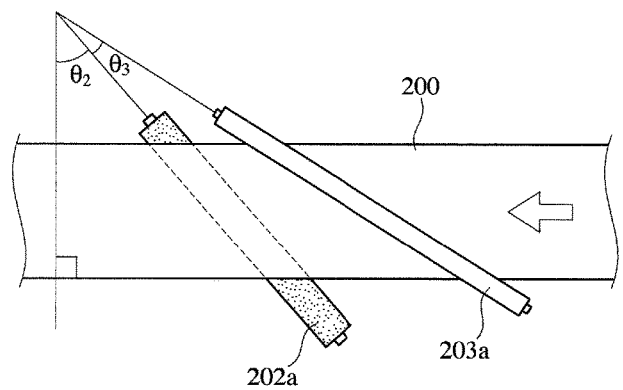
FIG. 6(e) is a partial plan view showing the inclination angles of a pattern roll and a push roll to a composite film in the apparatus of FIG. 6(a).

FIG. 6(d) shows the principle that linear scratches 113a are formed on the composite film 200 with inclination to the moving direction thereof. Because the pattern roll 202a is inclined to the moving direction of the composite film 200, the moving direction (rotation direction) a of fine, hard particles on the pattern roll 202a differs from the moving direction b of the composite film 200. After a fine, hard particle at a point A on the pattern roll 202a comes into contact with the thin metal film 111b to form a scratch B at an arbitrary time as shown by X, the fine, hard particle moves to a point A', and the scratch B moves to a point B', in a predetermined period of time. While the fine, hard particle moves from the point A to the point A', the scratch is continuously formed, resulting in a linear scratch 113a extending from the point B' to the point A'.

The directions and crossing angle θs of the first and second linear scratch groups formed by the first and second pattern rolls 202a, 202b can be adjusted by changing the angle of each pattern roll 202a, 202b to the composite film 200, and/or the peripheral speed of each pattern roll 202a, 202b relative to the moving speed of the composite film 200. For instance, when the peripheral speed a of the pattern roll 202a relative to the moving speed b of the composite film 200 increases, the linear scratches 113a can be inclined 45° to the moving direction of the composite film 200 like a line C'D' as shown by Y in FIG. 6(d). Similarly, the peripheral speed a of the pattern roll 202a can be changed by changing the inclination angle $\theta_2$ of the pattern roll 202a to the lateral direction of the composite film 200. This is true of the pattern roll 202b. Accordingly, with both pattern rolls 202a, 202b adjusted, the directions of the linear scratches 113a, 113b can be changed.

Because each pattern roll 202a, 202b is inclined to the composite film 200, sliding contact with each pattern roll 202a, 202b is likely to exert a force in a lateral direction onto the composite film 200. To prevent the lateral displacement of the composite film 200, it is preferable to adjust the vertical position and/or angle of each push roll 203a, 203b to each pattern roll 202a, 202b. For instance, the proper adjustment of a crossing angle $\theta_3$ between the axis of the pattern roll 202a and the axis of the push roll 203a can provide pressing power with such a lateral direction distribution as to cancel lateral components, thereby preventing the lateral displacement. The adjustment of the distance between the pattern roll 202a and the push roll 203a also contributes to the prevention of the lateral displacement. To prevent the lateral displacement and breakage of the composite film 200, the rotation directions of the first and second pattern rolls 202a, 202b inclined from the lateral direction of the composite film 200 are preferably the same as the moving direction of the composite film 200.

As shown in FIG. 6(b), each electric-resistance-measuring means (roll) 204a, 204b comprises a pair of electrodes (not shown) at both ends via an insulating portion, between which the electric resistance of the linearly scratched thin metal film 111b is measured. The electric resistance measured by the electric-resistance-measuring means 204a, 204b is compared with the target electric resistance, to adjust the operation conditions such as the moving speed of the composite film 200, the rotation speeds and inclination angles $\theta_2$ of the pattern rolls 202a, 202b, the positions and inclination angles $\theta_3$ of the push rolls 203a, 203b, etc., depending on their difference.

Figure 7:
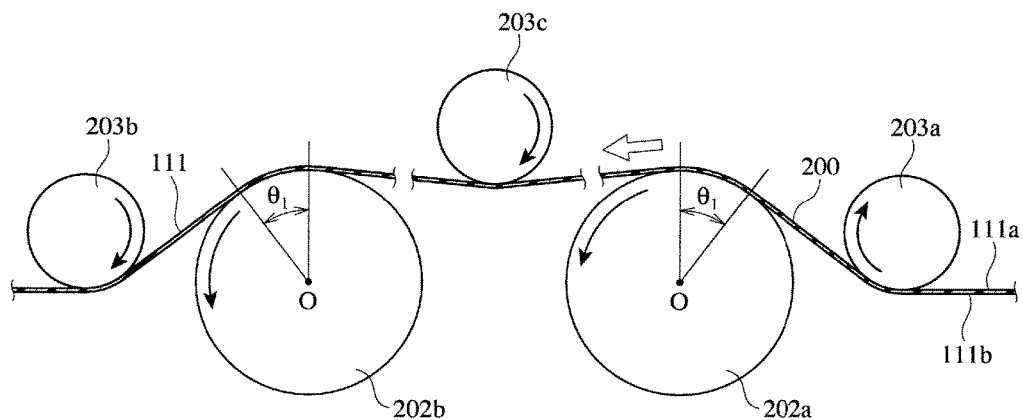
FIG. 7 is a partial cross-sectional view showing another example of the apparatuses for forming linear scratches.

To increase the pressing forces of the pattern rolls 202a, 202b to the composite film 200, a third push roll 203c may be provided between the pattern rolls 202a, 202b as shown in FIG. 7. The third push roll 203c increases the sliding distance of the thin metal film 111b proportional to a center angle $\theta_1$, resulting in longer linear scratches 113a, 113b. The adjustment of the position and inclination angle of the third push roll 203c can contribute to the prevention of the lateral displacement of the composite film 200.

Operation conditions determining not only the inclination angles and crossing angles of linear scratches but also their depths, widths, lengths and intervals are the moving speed of the composite film 200, the rotation speeds, inclination angles and pressing forces of the pattern rolls, the tension of the composite film 200, etc. The moving speed of the composite film is preferably 5-200 m/minute, and the peripheral speed of the pattern roll 200 is preferably 10-2,000 m/minute. The inclination angles $\theta_2$ of the pattern rolls are preferably 20° to 60°, particularly about 45°. The tension of the composite film 200 is preferably 0.05-5 kgf/cm width.

The pattern roll for forming linear scratches is preferably a roll having fine, hard particles with sharp edges and Mohs hardness of 5 or more on the surface, for example, the diamond roll described in JP 2002-59487 A. Because the widths of linear scratches are determined by the sizes of fine, hard particles, 90% or more of fine, hard particles preferably have sizes in a range of 1-1,000 μm, more preferably in a range of 10-200 μm. The fine, hard particles are attached to the roll surface preferably at an area ratio of 50% or more.

Figure 8:
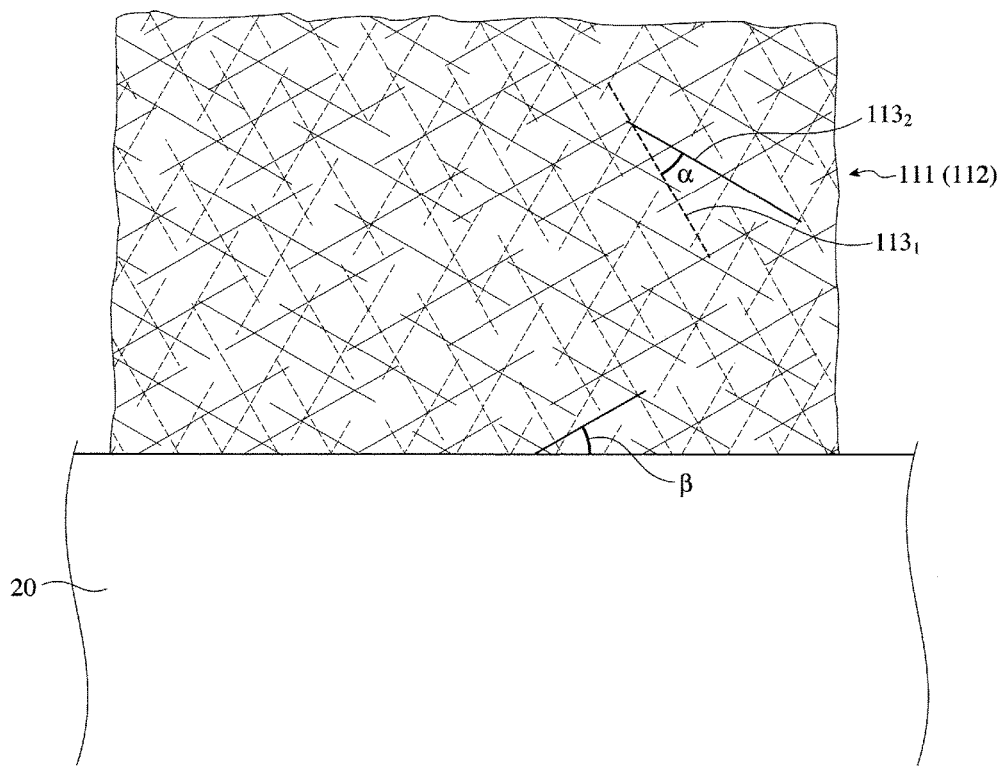
FIG. 8 is an enlarged schematic view showing the orientations (crossing angle) of linear scratches in two electromagnetic-wave-absorbing films.

(f) Directions of Linear Scratches (i) Crossing Angle of Linear Scratches in Two Electromagnetic-Wave-Absorbing Films As shown in FIG. 8, two electromagnetic-wave-absorbing films 111, 112 are laminated with the linear scratches $113_1$, $113_2$ crossing. With no crossing of the linear scratches $113_1$, $113_2$, a sufficient effect of laminating two electromagnetic-wave-absorbing films 111, 112 cannot be obtained. The minimum crossing angle α between the linear scratches $113_1$ of one electromagnetic-wave-absorbing film 111 and the linear scratches $113_2$ of the other electromagnetic-wave-absorbing film 112 is preferably 10° to 45°. The minimum crossing angle α of less than 10° or more than 45° leads to lower electromagnetic wave absorbability. The minimum crossing angle α is more preferably 15° to 45°, most preferably 20° to 45°.

(ii) Directions of Linear Scratches to Conductor Cable

As shown in FIG. 8, any linear scratches $113_1$, $113_2$ of two electromagnetic-wave-absorbing films 111, 112 are preferably inclined to the conductor cable 20. The minimum inclination angle β of the linear scratches $113_1$, $113_2$ to the conductor cable 20 is preferably 10-45°, more preferably 15-35°. With the inclination angle β of 10-45°, the electromagnetic-wave-absorbing layer constituted by a laminate of two electromagnetic-wave-absorbing films can exhibit higher electromagnetic wave absorbability.

(g) Length Ratio of Two Electromagnetic-Wave-Absorbing Films

Figure 4:
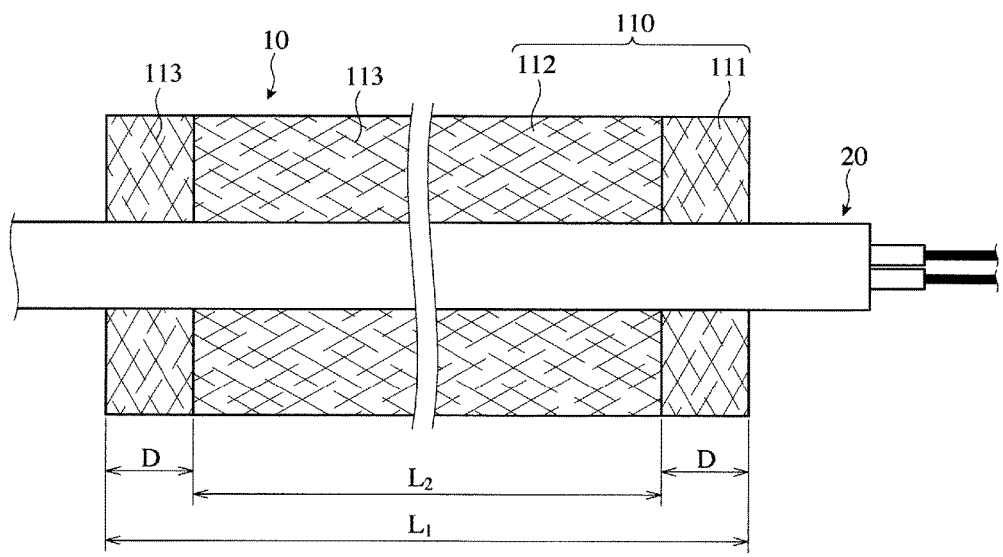
FIG. 4 is a developed plan view showing the arrangement of two electromagnetic-wave-absorbing films in the electromagnetic-wave-absorbing filter of the present invention.

As shown in FIGS. 3 and 4, an $L_2/L_1$ ratio, wherein $L_1$ represents the length of one (longer) electromagnetic-wave-absorbing film 111, and $L_2$ represents the length of the other (shorter) electromagnetic-wave-absorbing film 112, is 30-70%. It has been found that when the $L_2/L_1$ ratio is less than 30% or more than 70%, the electromagnetic-wave-absorbing layer constituted by a laminate of two electromagnetic-wave-absorbing films has low electromagnetic wave absorbability. This is an unexpected result. Accordingly, the $L_2/L_1$ ratio of 30-70% is an important feature of the present invention. The lower limit of the $L_2/L_1$ ratio is preferably 40%, more preferably 45%. The upper limit of the $L_2/L_1$ ratio is preferably 65%, more preferably 60%.

The shorter electromagnetic-wave-absorbing film 112 is preferably arranged in a longitudinal center portion of the longer electromagnetic-wave-absorbing film 111. For example, when the $L_2/L_1$ ratio is 50%, the end-to-end distance D between the electromagnetic-wave-absorbing film 112 and the electromagnetic-wave-absorbing film 111 is preferably 25% [(100%−50%)/2] on both end sides.

Though an inside electromagnetic-wave-absorbing film 111 (on the side of the conductor cable 20) is longer than an outside electromagnetic-wave-absorbing film 112 in the depicted example, this is not restrictive, but the outside electromagnetic-wave-absorbing film 112 may be longer than the inside electromagnetic-wave-absorbing film 111. Accordingly, one electromagnetic-wave-absorbing film in the present invention is either one of the inside and outside electromagnetic-wave-absorbing films 111, 112. Though two electromagnetic-wave-absorbing films may have the same or different widths, two electromagnetic-wave-absorbing films preferably have the same width to obtain sufficient electromagnetic wave absorbability over the entire surface.

(2) Insulating Layer

The insulating layer 120 for separating the electromagnetic-wave-shielding layer 130 from the electromagnetic-wave-absorbing layer 110 is preferably made of a thermoplastic resin or rubber having high insulation and flexibility. The thermoplastic resins are preferably polyethylene, polyvinyl chloride, etc., and the rubber are preferably natural rubber, chloroprene rubber, butyl rubber, silicone rubber, ethylene-propylene rubber, urethane rubber, etc.

The thickness of the insulating layer 120 is preferably 0.5 mm or more, more preferably 1 mm or more. When the insulating layer 120 is thinner than 0.5 mm, the electromagnetic-wave-absorbing layer 110 is too close to the electromagnetic-wave-shielding layer 130, resulting in an insufficient effect of attenuating electromagnetic waves transmitting the electromagnetic-wave-absorbing layer 110. Though depending on the outer diameter of the conductor cable 20, the upper limit of the thickness of the insulating layer 120 is preferably 1.5 mm, more preferably 1.2 mm.

The insulating layer 120 may contain insulating magnetic particles. The magnetic particles are preferably high-insulation ferrite particles. The sizes of ferrite particles are not particularly restricted, as long as the ferrite particles do not hinder the formation of the insulating layer 120.

(3) Electromagnetic-Wave-Shielding Layer

In order that electromagnetic waves passing through the electromagnetic-wave-absorbing layer 110 are reflected to the electromagnetic-wave-absorbing layer 110, the electromagnetic-wave-shielding layer 130 should have a function of reflecting electromagnetic waves. To exhibit such reflecting function effectively, the electromagnetic-wave-shielding layer 130 is preferably a plastic film provided with a metal foil, a metal net or a thin metal film. To make the electromagnetic-wave-absorbing filter 10 thinner, the electromagnetic-wave-shielding layer 130 is preferably a thin metal film formed on a surface of a plastic film. The thin metal film is preferably made of at least one metal selected from the group consisting of aluminum, copper, silver, tin, nickel, cobalt, chromium and their alloys. The thin metal film is preferably a vapor-deposited film of the above metal. The thickness of the thin metal film is several tens of nanometers to several tens of micrometers. The plastic film in the electromagnetic-wave-shielding layer 130 may be the same as the plastic films 111a, 112a in the electromagnetic-wave-absorbing films 111, 112.

When the electromagnetic-wave-shielding layer 130 is a composite film 131 constituted by a plastic film and a thin metal film formed on a surface of the plastic film, a ground line 132 is preferably attached to the composite film 131 as shown in FIGS. 1 and 2. Because electric current generated in the thin metal film flows out through the ground line 132, the electromagnetic-wave-shielding function can be improved. When the electromagnetic-wave-shielding layer 130 is a conductive metal foil or net, the ground line 132 need not be additionally attached.

(4) Adhesive Layer

Figure 9:
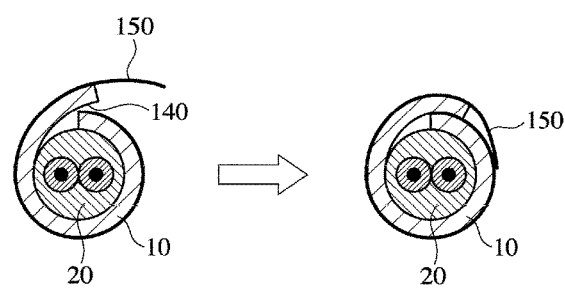
FIG. 9 is a schematic cross-sectional view showing an electromagnetic-wave-absorbing filter wound around a conductor cable.

To fix the electromagnetic-wave-absorbing filter 10 to the conductor cable 20 stably, as shown in FIG. 9, an adhesive layer 140 is preferably formed on an inner surface of the electromagnetic-wave-absorbing layer 110. The adhesives may be known ones.

(5) Adhesive Film

To provide good appearance to the electromagnetic-wave-absorbing filter 10 wound around the conductor cable 20, as shown in FIG. 9, an adhesive film 150 sufficiently longer than the electromagnetic-wave-shielding layer 130 is preferably adhered to an outer surface of the electromagnetic-wave-shielding layer 130, and wound around the entire surface of the electromagnetic-wave-absorbing filter 10.

(6) Length of Electromagnetic-Wave-Absorbing Filter

Though not restrictive, the length of the electromagnetic-wave-absorbing filter of the present invention having the above structure may be, for example, about 30-200 mm. When a long electromagnetic-wave-absorbing filter is desired, pluralities of electromagnetic-wave-absorbing filters may be longitudinally connected.

(7) Width of Electromagnetic-Wave-Absorbing Filter

Though the electromagnetic-wave-absorbing filter 10 of the present invention need only have such width as to cover the conductor cable 20 substantially circumferentially entirely, it preferably has a slightly larger width than the outer peripheries of most conductor cables, so that it can be used for conductor cables having different outer diameters.

The present invention will be explained in more detail referring to Examples below without intention of restricting the present invention thereto.

Reference Example 1

Using an apparatus having the structure shown in FIG. 6(a) comprising pattern rolls 232a, 232b having electroplated fine diamond particles having a particle size distribution of 50-80 µm, linear scratches oriented in two directions with an acute crossing angle θs of 45° were formed in a thin aluminum film having a thickness of 0.05 µm, which was formed on a surface of a biaxially oriented polyethylene terephthalate (PET) film as thick as 16 µm by a vacuum vapor deposition method. An optical photomicrograph of the linearly-scratched, thin aluminum film revealed that the linear scratches had the following characteristics.

Range of widths W: 0.5-5 µm,
Average width Wav: 2 µm,
Range of intervals I: 2-30 µm,
Average interval Iav: 20 µm,
Average length Lsav: 5 mm, and
Acute crossing angle θs: 45°.

Reference Example 2

Linear scratches oriented in two directions with an acute crossing angle θs of 60° were formed in the thin aluminum film in the same manner as in Reference Example 1, except for changing the inclination angles of the pattern rolls 232a, 232b. An optical photomicrograph of the linearly-scratched, thin aluminum film revealed that the linear scratches had the following characteristics.

Range of widths W: 0.5-5 µm,
Average width Wav: 2 µm,
Range of intervals I: 2-30 µm,
Average interval Iav: 20 µm,
Average length Lsav: 5 mm, and
Acute crossing angle θs: 60°.

Example 1

Figure 10:
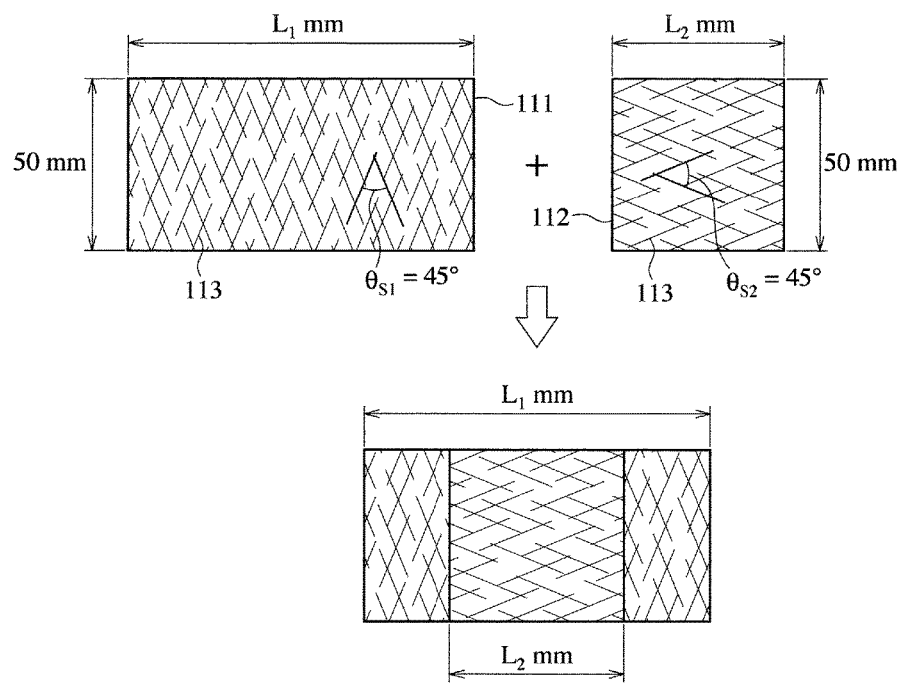
FIG. 10 is a plan view showing a laminate of two electromagnetic-wave-absorbing films used in Examples.

First electromagnetic-wave-absorbing film pieces having sizes of $L_1$ (=100) mm×50 mm, and second electromagnetic-wave-absorbing film pieces having sizes of $L_2$ mm×50 mm were cut out of the electromagnetic-wave-absorbing film obtained in Reference Example 1, which had linear scratches with a crossing angle θs of 45°. $L_2$ were 0 mm, 30 mm, 40 mm, 50 mm, 60 mm, 70 mm, and 100 mm, respectively. The cutting directions of two electromagnetic-wave-absorbing film pieces were set, such that when two electromagnetic-wave-absorbing film pieces were overlapped with their lateral ends aligned, the minimum crossing angle α of their linear scratches were 45°. As shown in FIG. 10, each first electromagnetic-wave-absorbing film piece 111 was laminated with each second electromagnetic-wave-absorbing film piece 112, such that (a) both thin metal films were facing above, and that (b) the second electromagnetic-wave-absorbing film piece 112 was arranged in a longitudinal center portion (along the cable) of the first electromagnetic-wave-absorbing film piece 111.

A 1-mm-thick butyl rubber sheet (insulating layer) 120 of $L_1$ mm×50 mm was laminated on a laminate (electromagnetic-wave-absorbing layer) of the first and second electromagnetic-wave-absorbing film pieces, and a Cu/Ni-vapor-deposited film (electromagnetic-wave-shielding layer) 130 of $L_1$ mm×50 mm with a Cu/Ni layer on the lower side was laminated on the butyl rubber sheet, to produce an electromagnetic-wave-absorbing filter sample Fs. The Cu/Ni-vapor-deposited film was obtained by forming a 0.1-μm-thick Ni layer and a 0.15-μm-thick Cu layer on a surface of a 16-μm-thick PET film by a vacuum vapor deposition method. A ground line 132 was connected to the Cu/Ni layer of the Cu/Ni-vapor-deposited film 130. A combination of the first and second electromagnetic-wave-absorbing film pieces 111, 112 in each electromagnetic-wave-absorbing filter sample Fs is shown in Table 1.

TABLE 1

| Sample No. | Electromagnetic-Wave-Absorbing Film Piece | | | |
|---|---|---|---|---|
| | θs (°) | $L_1$ (mm) | $L_2$ (mm) | $L_2/L_1$ Ratio (%) |
| 11* | 45 | 100 | 0 | 0 |
| 12 | 45 | 100 | 30 | 30 |
| 13 | 45 | 100 | 40 | 40 |
| 14 | 45 | 100 | 50 | 50 |
| 15 | 45 | 100 | 60 | 60 |
| 16 | 45 | 100 | 70 | 70 |
| 17* | 45 | 100 | 100 | 100 |

Note:
Samples with * are Comparative Examples.

Figure 11A:
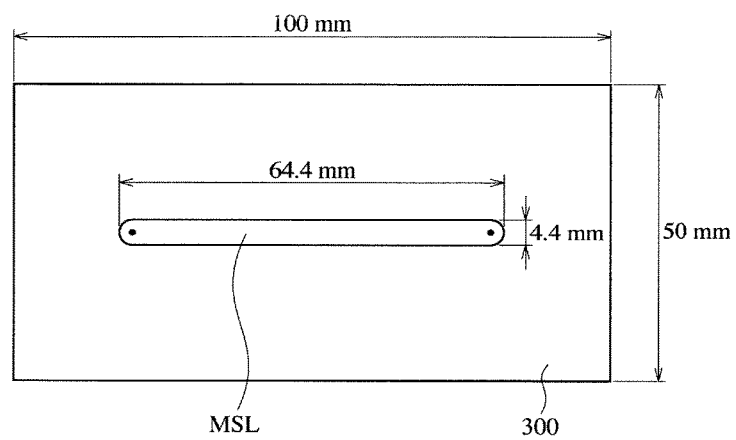
FIG. 11(a) is a plan view showing a system for measuring the powers of reflected wave and transmitted wave.
Figure 11B:
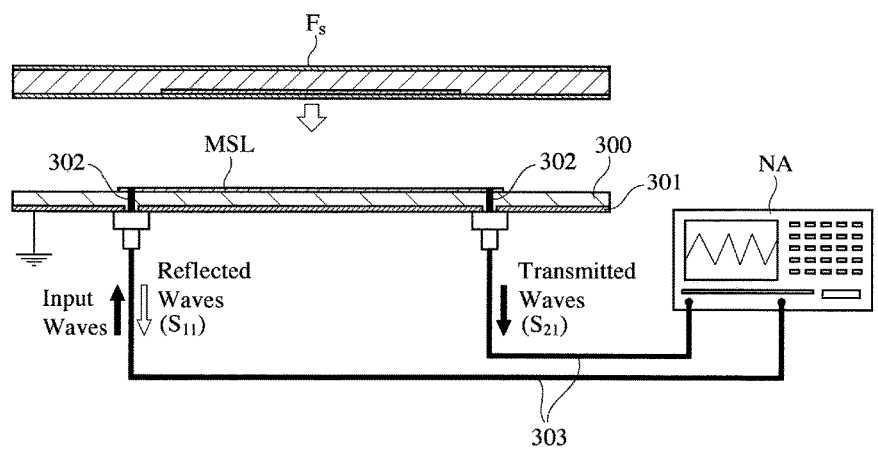
FIG. 11(b) is a schematic, partial cross-sectional view showing the system of FIG. 11(a).
Figure 12:
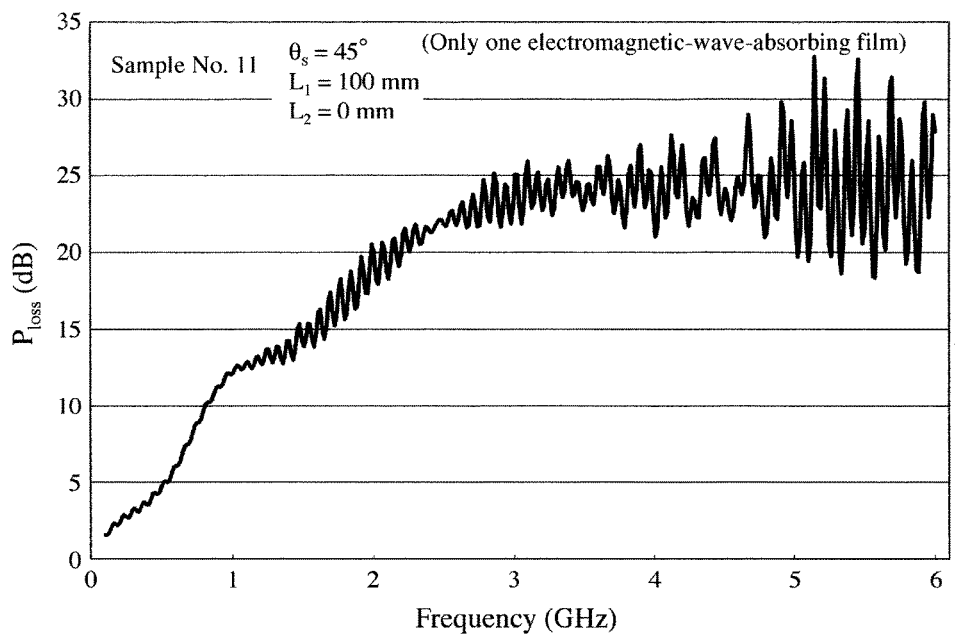
FIG. 12 is a graph showing the power loss $P_{loss}$ of Sample No. 11 of an electromagnetic-wave-absorbing filter ($L_2$=0 mm).
Figure 13:
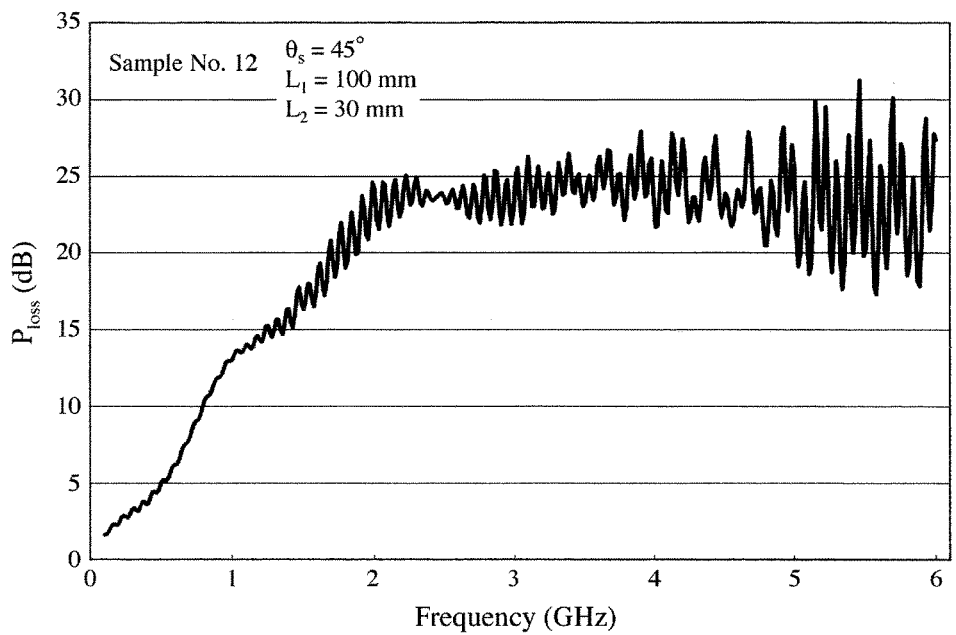
FIG. 13 is a graph showing the power loss $P_{loss}$ of Sample No. 12 of an electromagnetic-wave-absorbing filter ($L_2$=30 mm).
Figure 14:
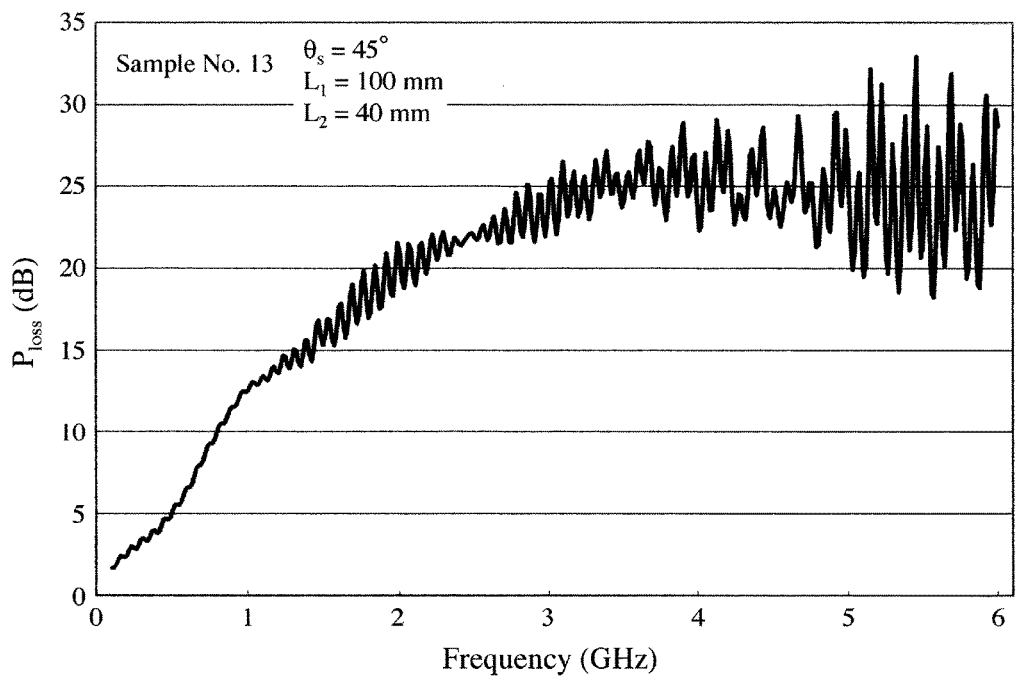
FIG. 14 is a graph showing the power loss $P_{loss}$ of Sample No. 13 of an electromagnetic-wave-absorbing filter ($L_2$=40 mm).
Figure 15:
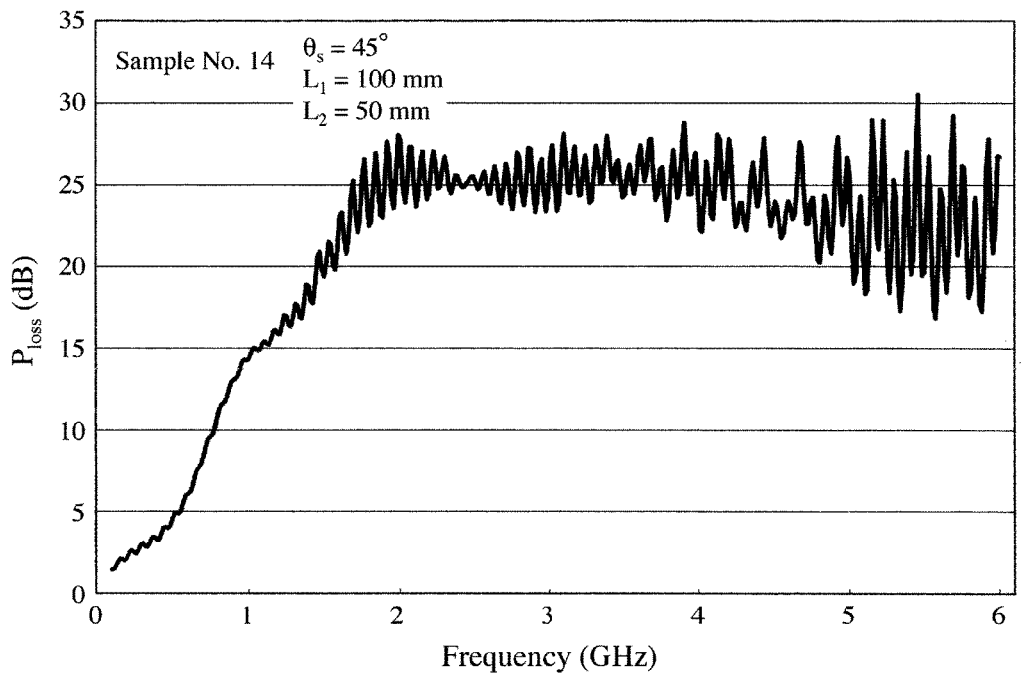
FIG. 15 is a graph showing the power loss $P_{loss}$ of Sample No. 14 of an electromagnetic-wave-absorbing filter ($L_2$=50 mm).
Figure 16:
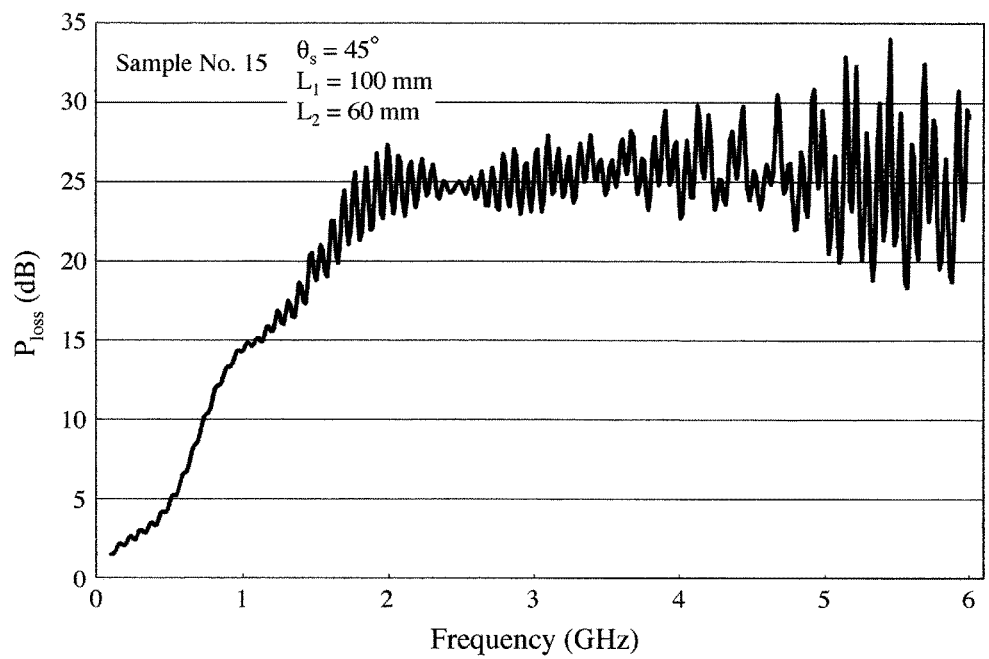
FIG. 16 is a graph showing the power loss $P_{loss}$ of Sample No. 15 of an electromagnetic-wave-absorbing filter ($L_2$=60 mm).
Figure 17:
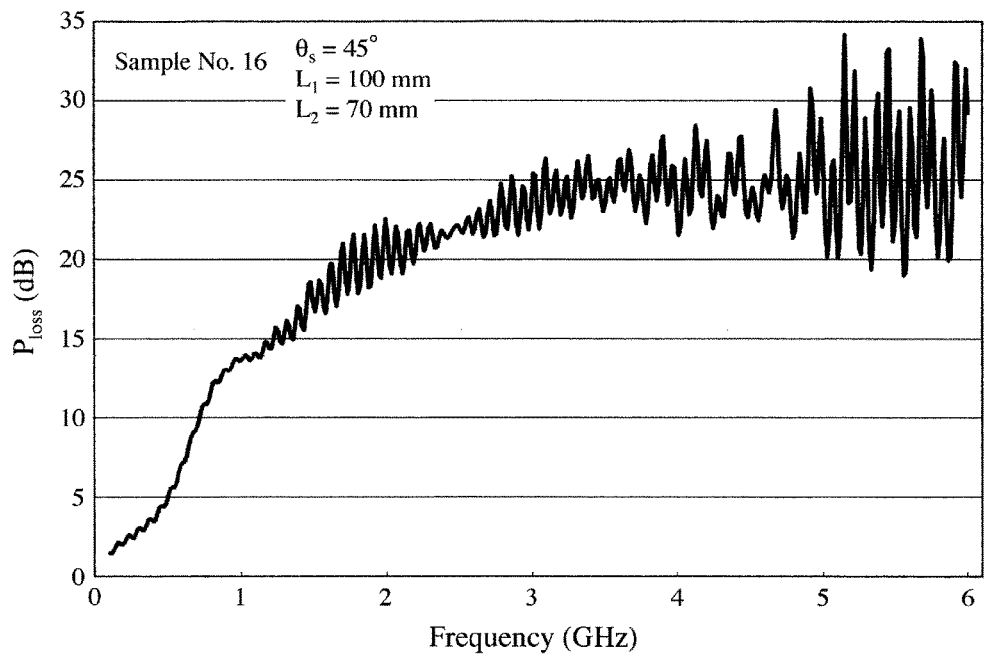
FIG. 17 is a graph showing the power loss $P_{loss}$ of Sample No. 16 of an electromagnetic-wave-absorbing filter ($L_2$=70 mm).
Figure 18:
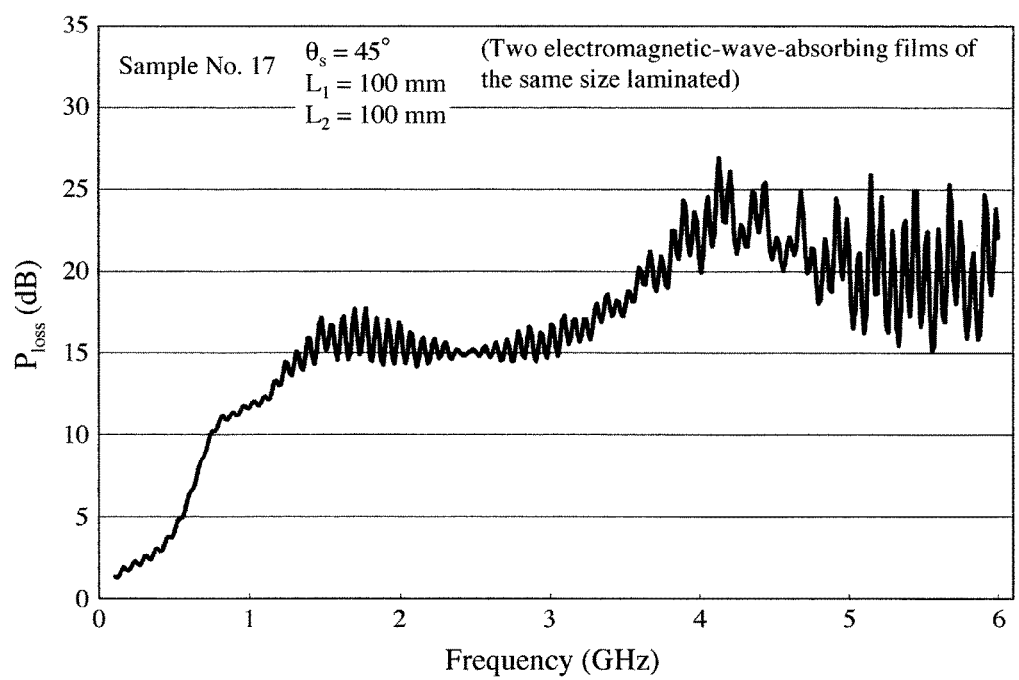
FIG. 18 is a graph showing the power loss $P_{loss}$ of Sample No. 17 of an electromagnetic-wave-absorbing filter ($L_2$=100 mm).
Figure 19:
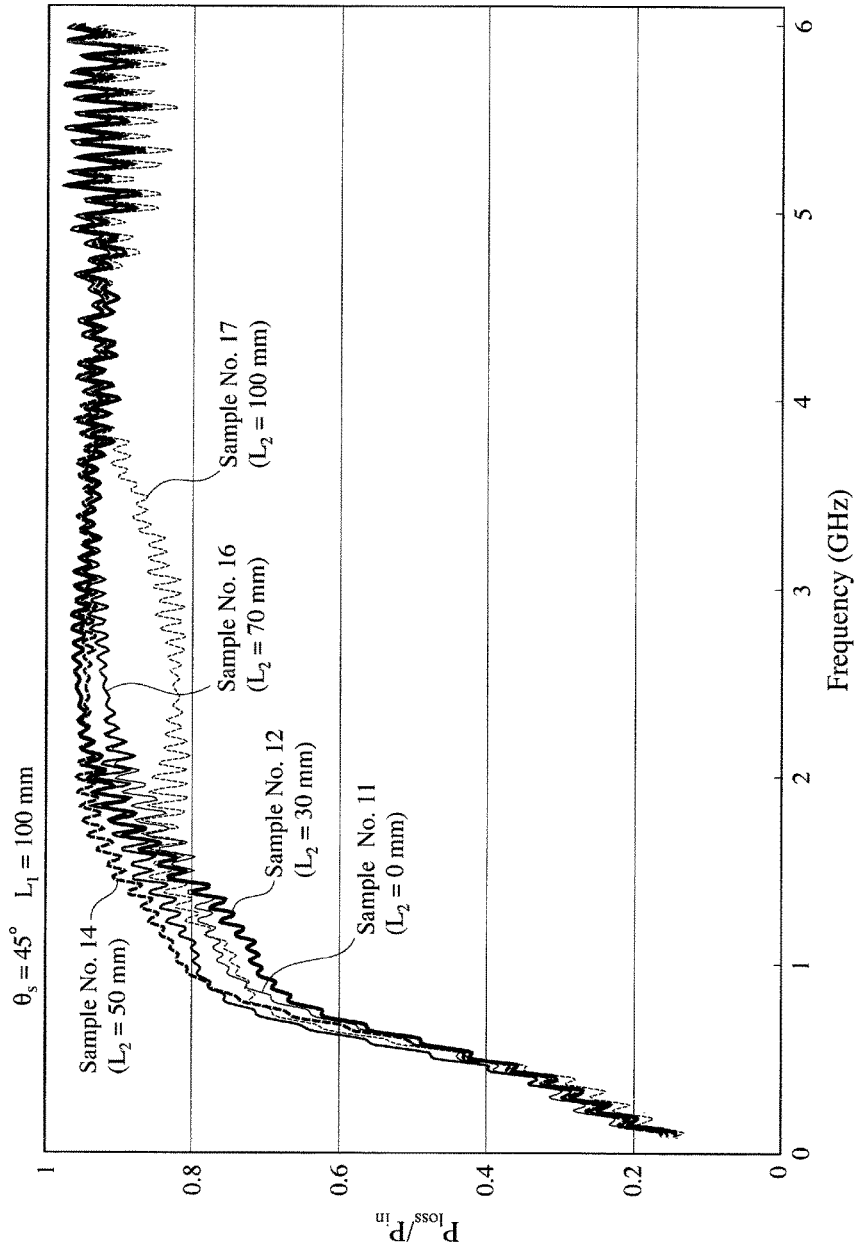
FIG. 19 is a graph showing the noise absorption ratios $P_{loss}/P_{in}$ of Samples No. 11, 12, 14, 16 and 17 of electromagnetic-wave-absorbing filters ($L_2$=0 mm, 30 mm, 50 mm, 70 mm, and 100 mm).
Figure 20:
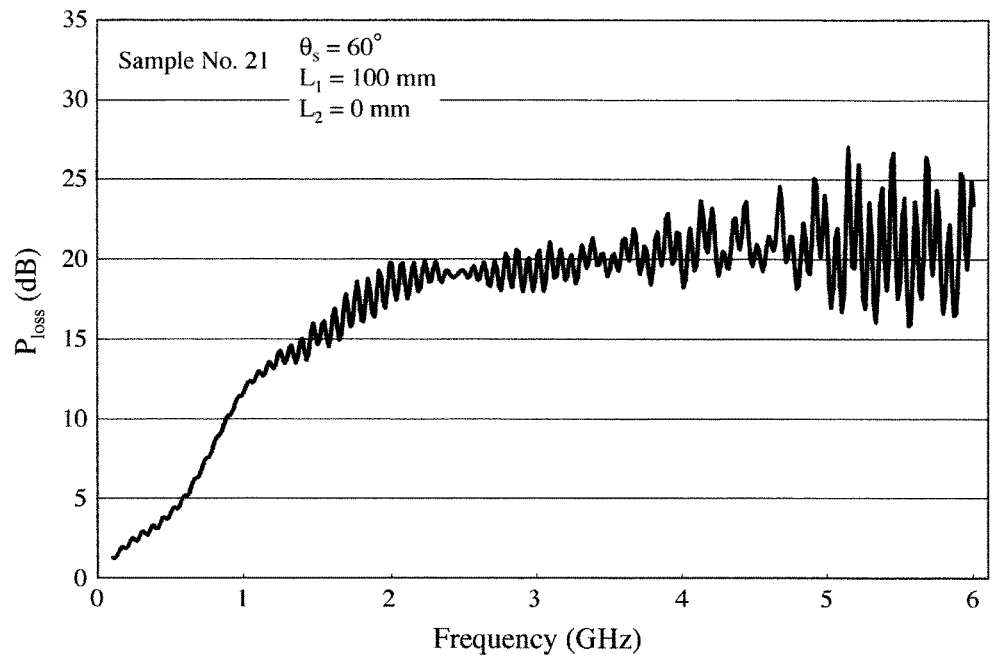
FIG. 20 is a graph showing the power loss $P_{loss}$ of Sample No. 21 of an electromagnetic-wave-absorbing filter ($L_2$=0 mm).
Figure 21:
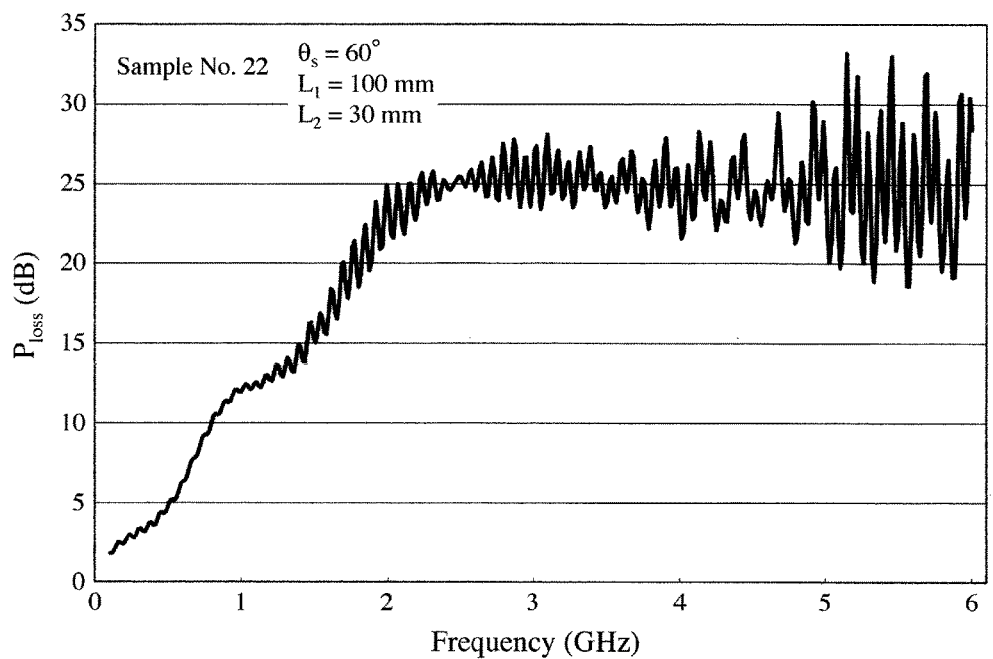
FIG. 21 is a graph showing the power loss $P_{loss}$ of Sample No. 22 of an electromagnetic-wave-absorbing filter ($L_2$=30 mm).
Figure 22:
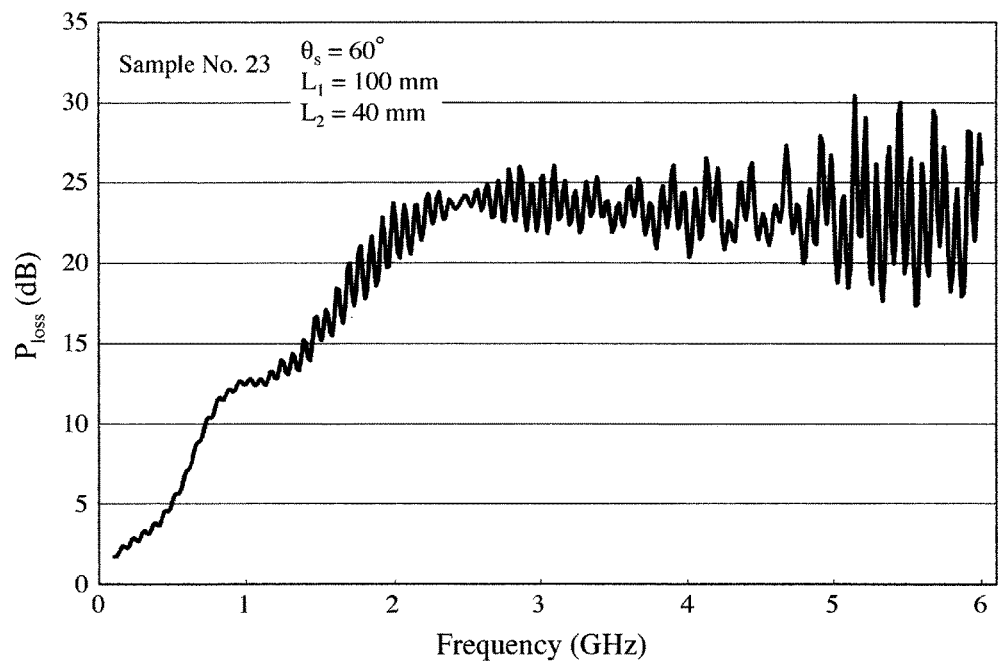
FIG. 22 is a graph showing the power loss $P_{loss}$ of Sample No. 23 of an electromagnetic-wave-absorbing filter ($L_2$=40 mm).
Figure 23:
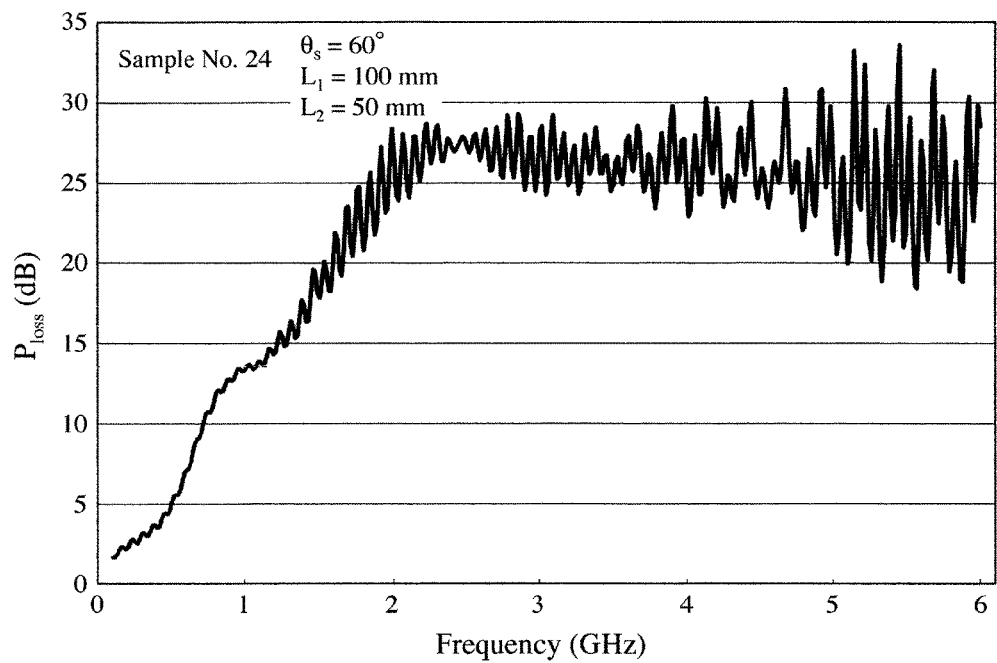
FIG. 23 is a graph showing the power loss $P_{loss}$ of Sample No. 24 of an electromagnetic-wave-absorbing filter ($L_2$=50 mm).
Figure 24:
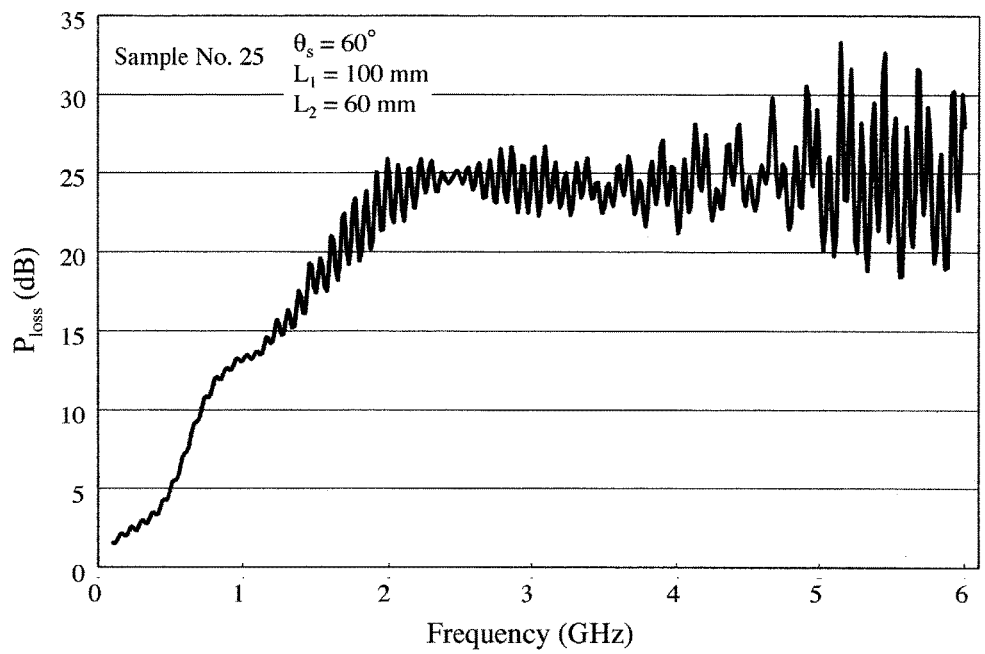
FIG. 24 is a graph showing the power loss $P_{loss}$ of Sample No. 25 of an electromagnetic-wave-absorbing filter ($L_2$=60 mm).
Figure 25:
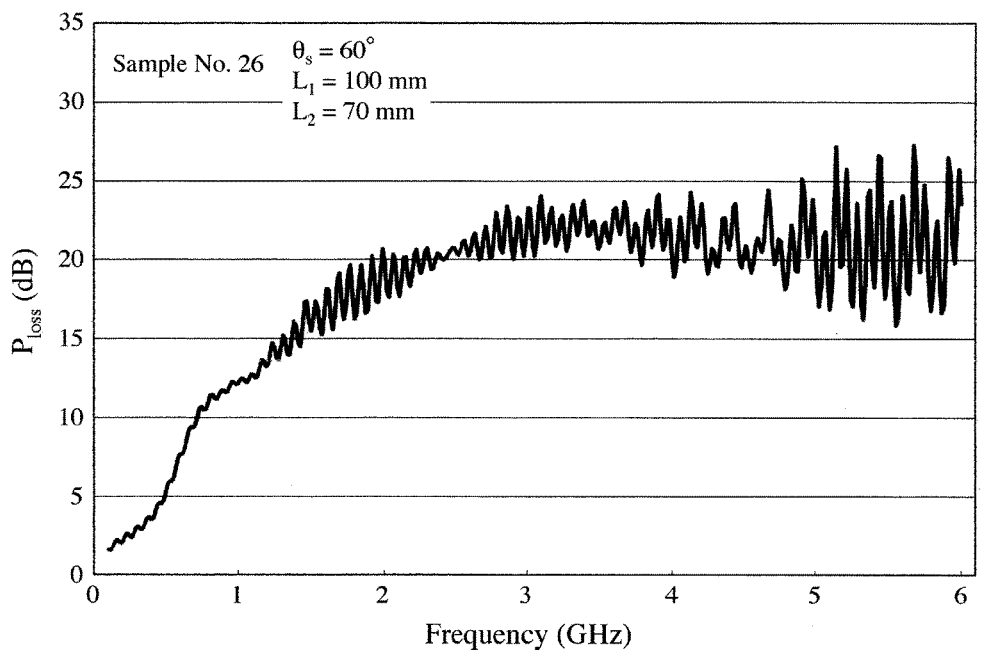
FIG. 25 is a graph showing the power loss $P_{loss}$ of Sample No. 26 of an electromagnetic-wave-absorbing filter ($L_2$=70 mm).
Figure 26:
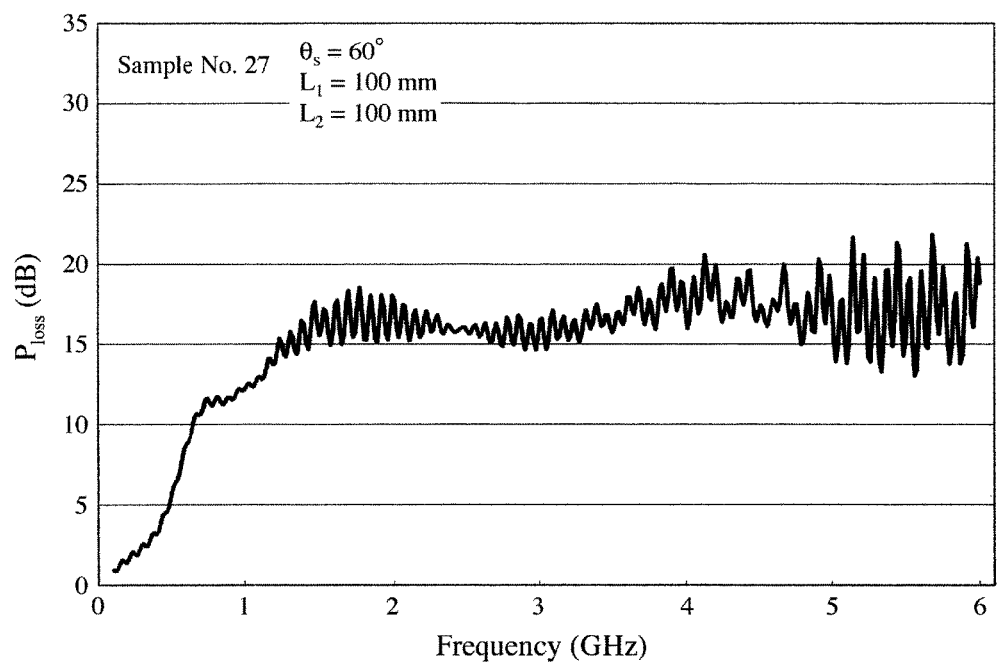
FIG. 26 is a graph showing the power loss $P_{loss}$ of Sample No. 27 of an electromagnetic-wave-absorbing filter ($L_2$=100 mm).
Figure 27:
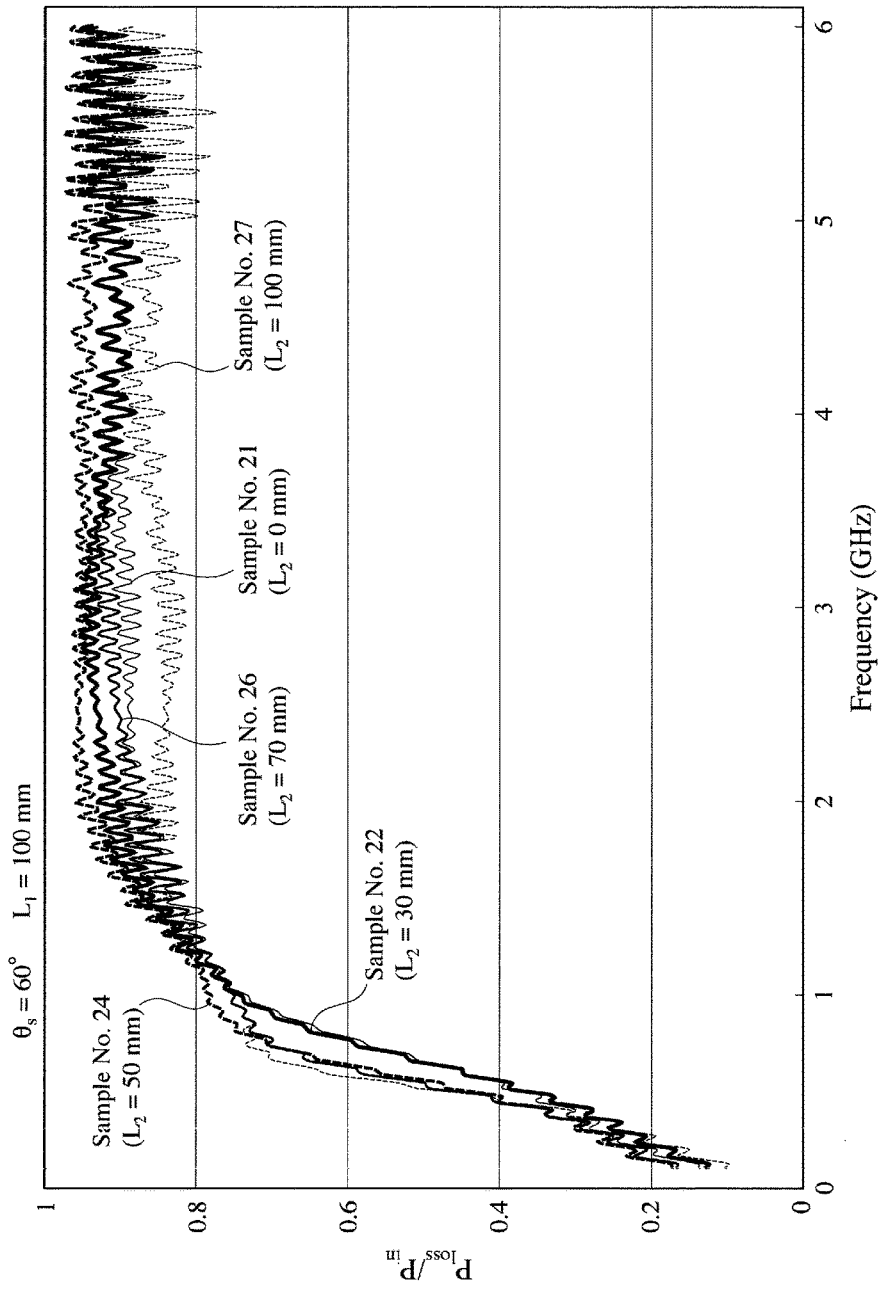
FIG. 27 is a graph showing the noise absorption ratios $P_{loss}/P_{in}$ of Samples No. 21, 22, 24, 26 and 27 of electromagnetic-wave-absorbing filters ($L_2$=0 mm, 30 mm, 50 mm, 70 mm, and 100 mm).
Figure 28:
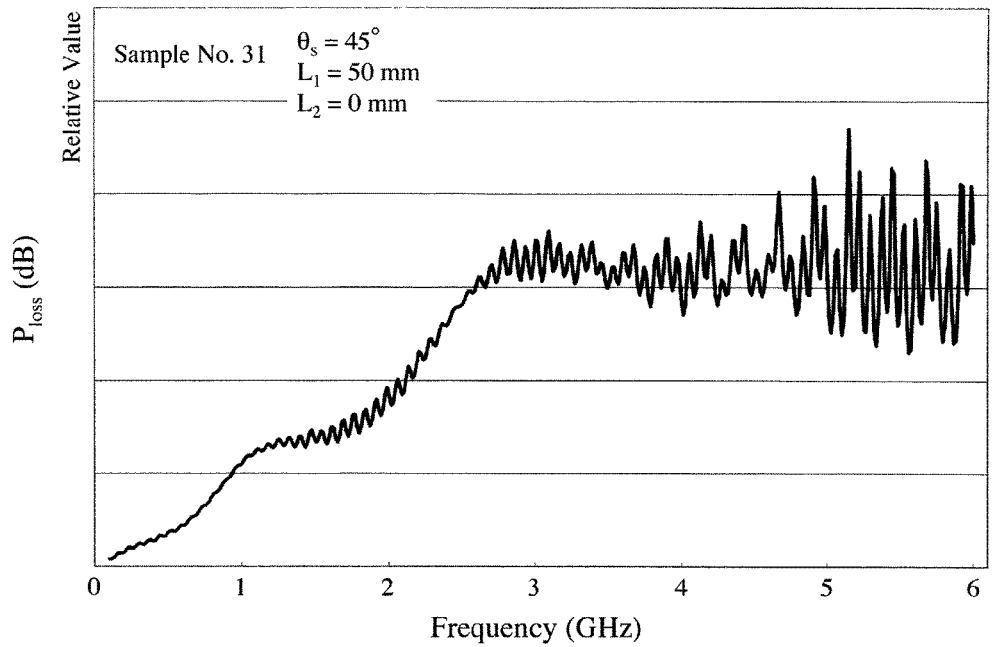
FIG. 28 is a graph showing the power loss $P_{loss}$ of Sample No. 31 of an electromagnetic-wave-absorbing filter ($L_2$=0 mm).
Figure 29:
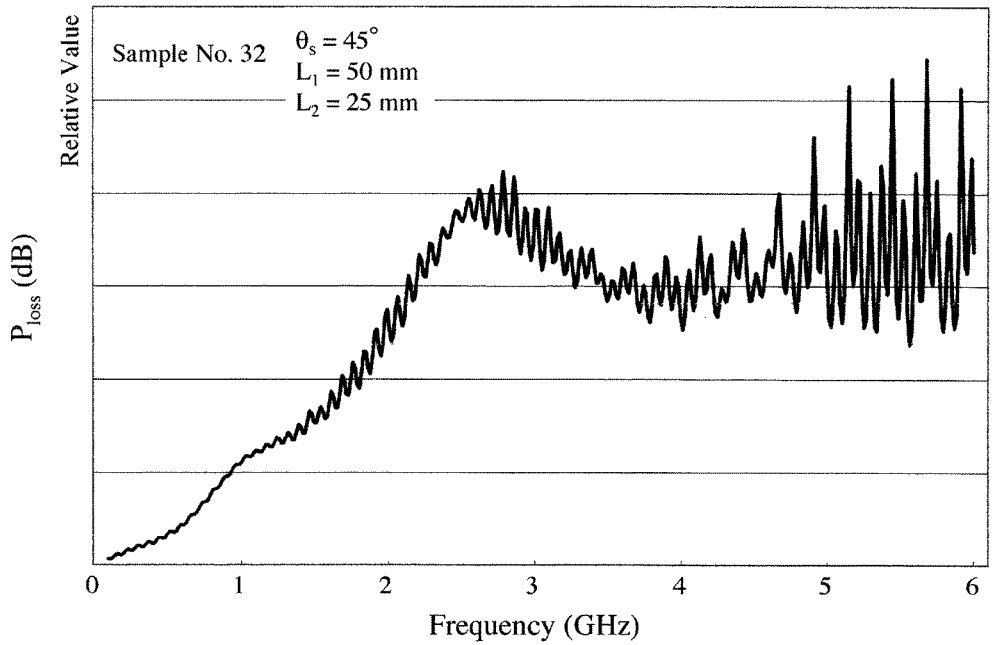
FIG. 29 is a graph showing the power loss $P_{loss}$ of Sample No. 32 of an electromagnetic-wave-absorbing filter ($L_2$=25 mm).
Figure 30:
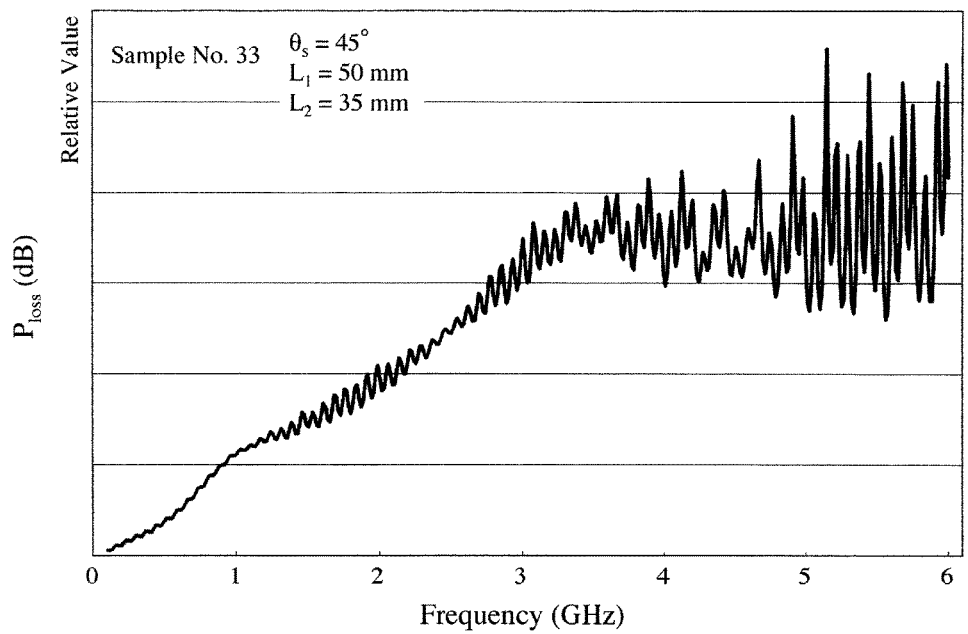
FIG. 30 is a graph showing the power loss $P_{loss}$ of Sample No. 33 of an electromagnetic-wave-absorbing filter ($L_2$=35 mm).
Figure 31:
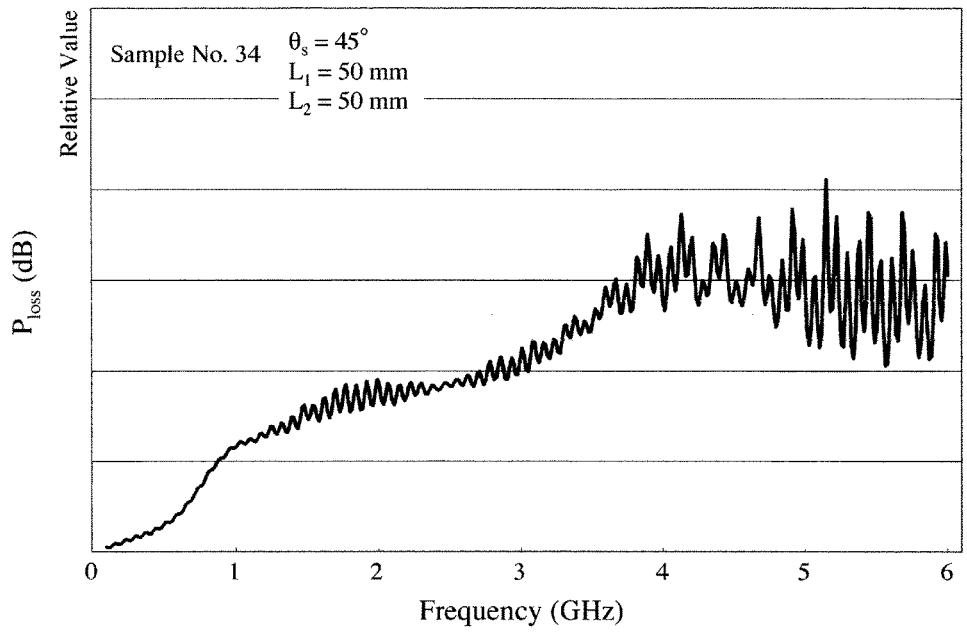
FIG. 31 is a graph showing the power loss $P_{loss}$ of Sample No. 34 of an electromagnetic-wave-absorbing filter ($L_2$=50 mm).
Figure 32:
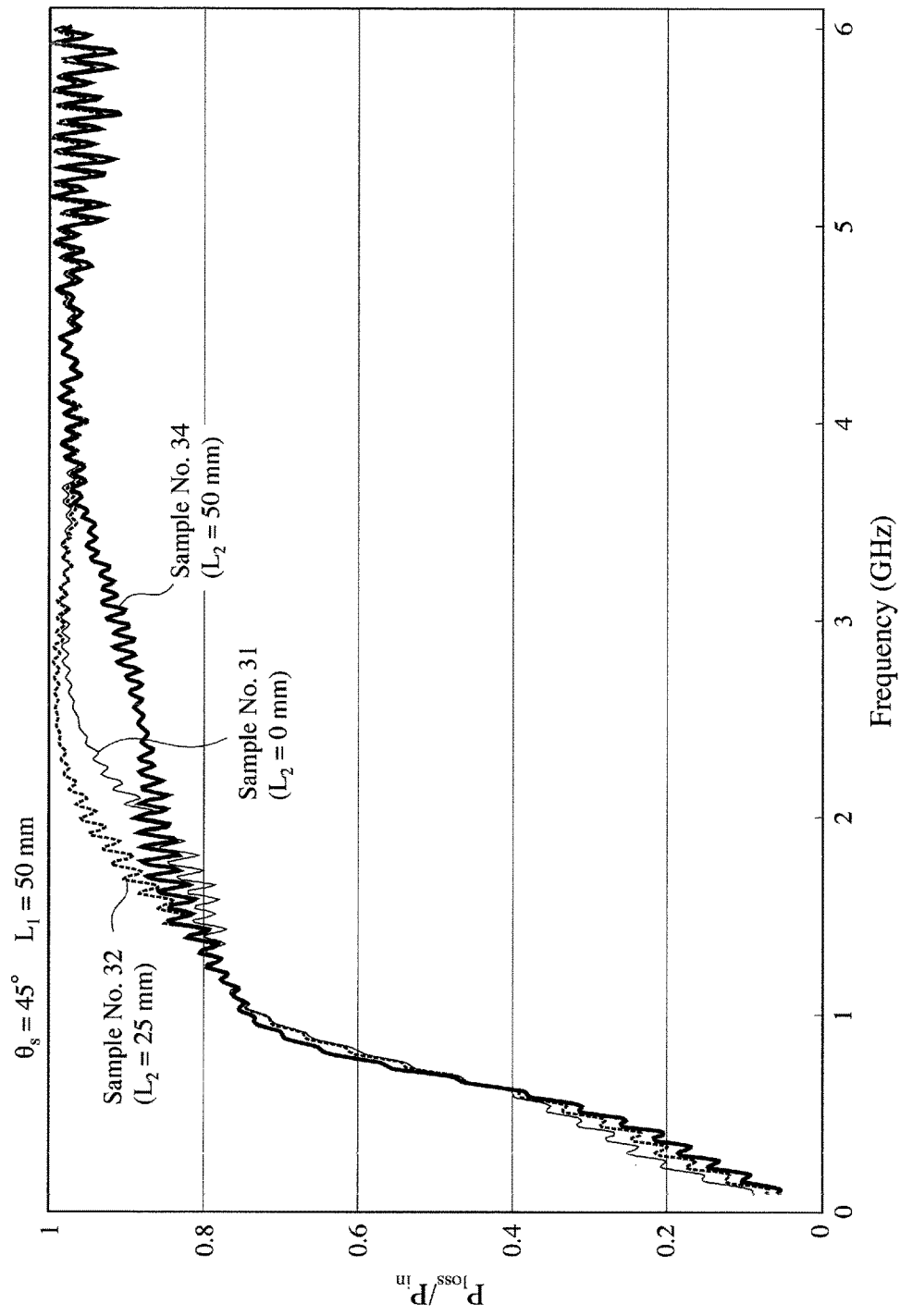
FIG. 32 is a graph showing the noise absorption ratios $P_{loss}/P_{in}$ of Samples No. 31, 32 and 34 of electromagnetic-wave-absorbing filters ($L_2$=0 mm, 25 mm and 50 mm).
Figure 33:
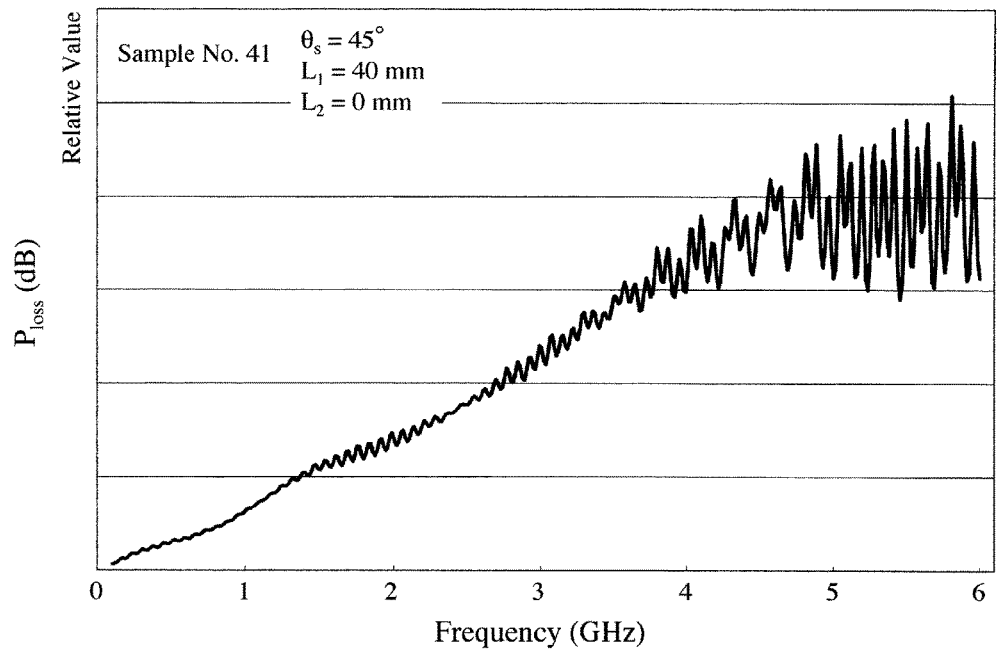
FIG. 33 is a graph showing the power loss $P_{loss}$ of Sample No. 41 of an electromagnetic-wave-absorbing filter ($L_2$=0 mm).
Figure 34:
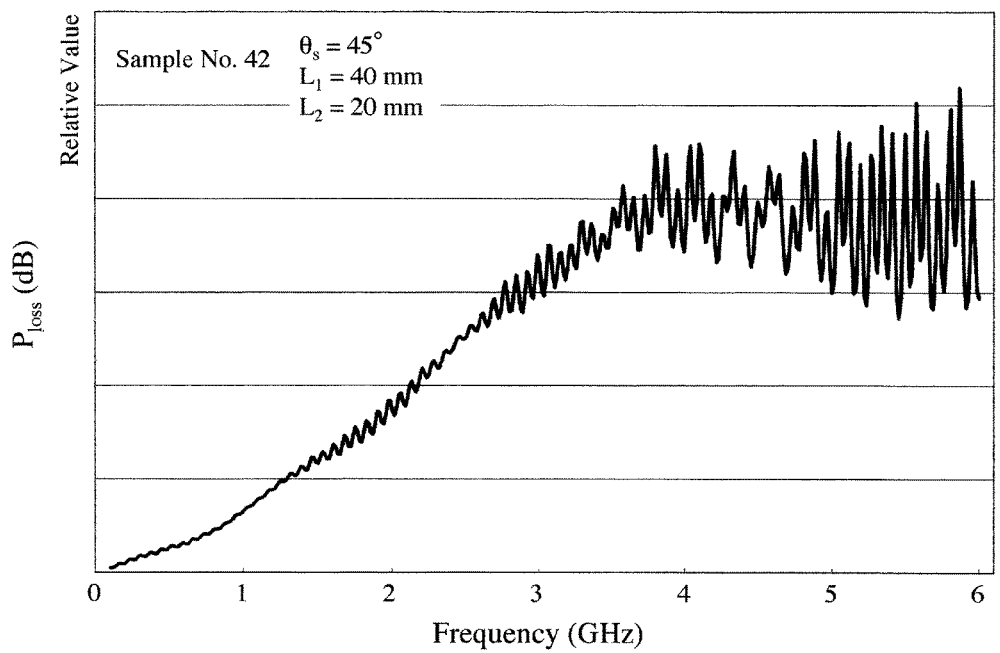
FIG. 34 is a graph showing the power loss $P_{loss}$ of Sample No. 42 of an electromagnetic-wave-absorbing filter ($L_2$=20 mm).
Figure 35:
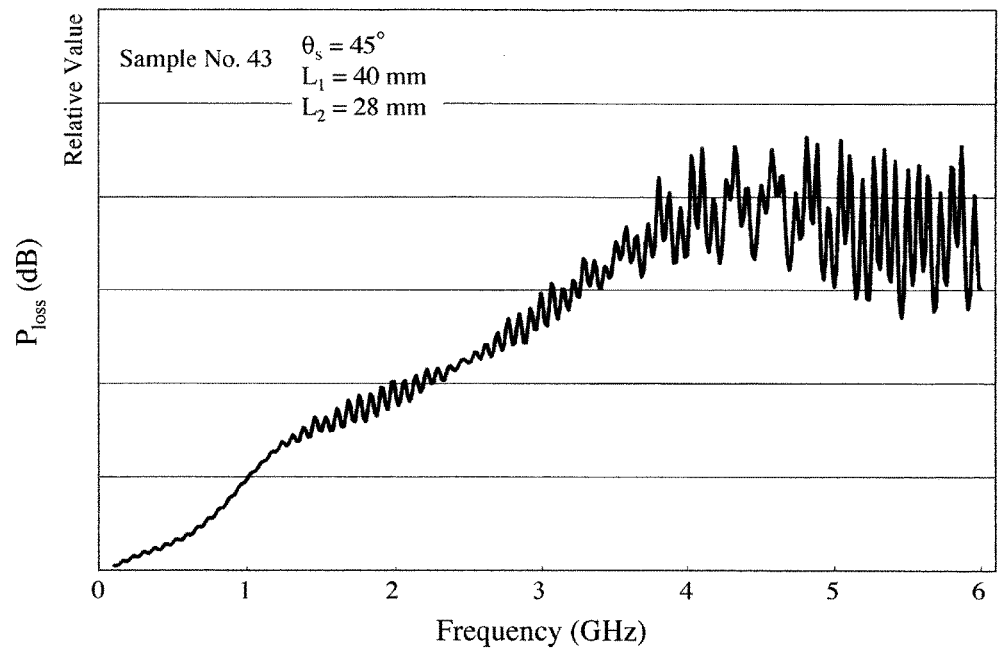
FIG. 35 is a graph showing the power loss $P_{loss}$ of Sample No. 43 of an electromagnetic-wave-absorbing filter ($L_2$=28 mm).
Figure 36:
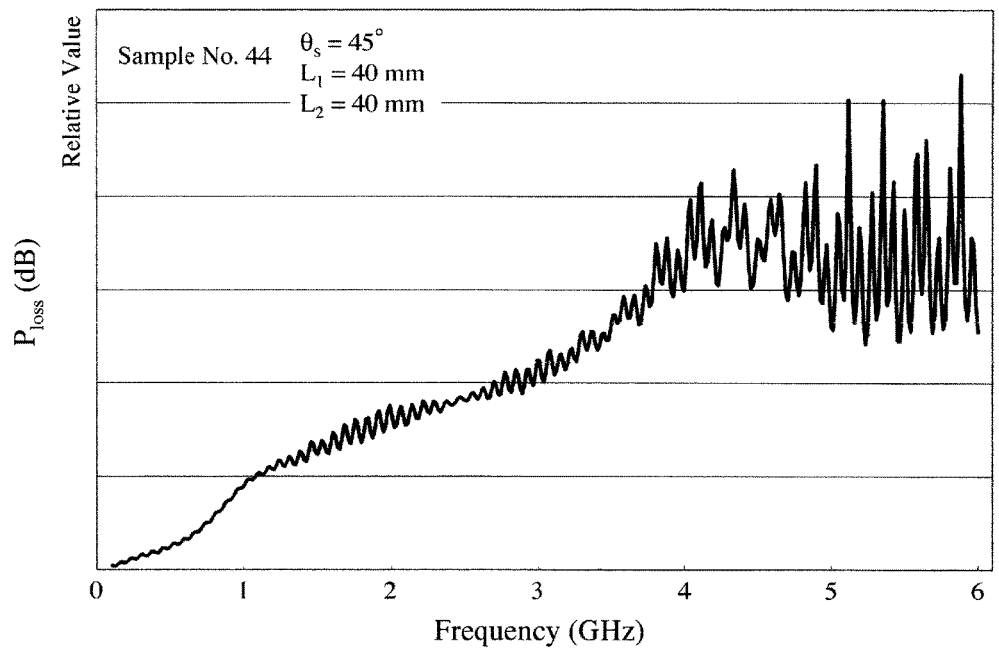
FIG. 36 is a graph showing the power loss $P_{loss}$ of Sample No. 44 of an electromagnetic-wave-absorbing filter ($L_2$=40 mm).
Figure 37:
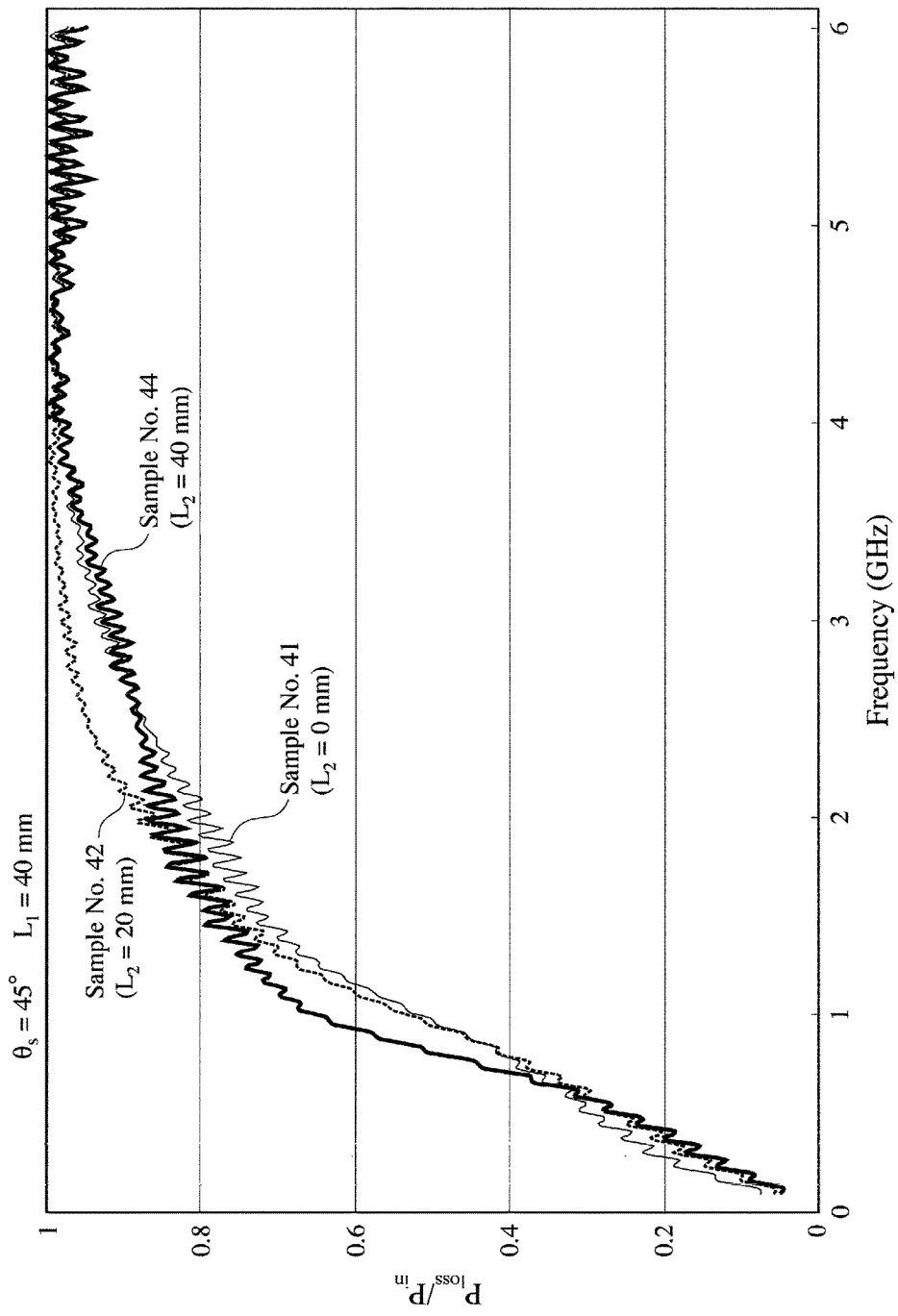
FIG. 37 is a graph showing the noise absorption ratios $P_{loss}/P_{in}$ of Samples No. 41, 42 and 44 of electromagnetic-wave-absorbing filters ($L_2$=0 mm, 20 mm and 40 mm).
Figure 38:
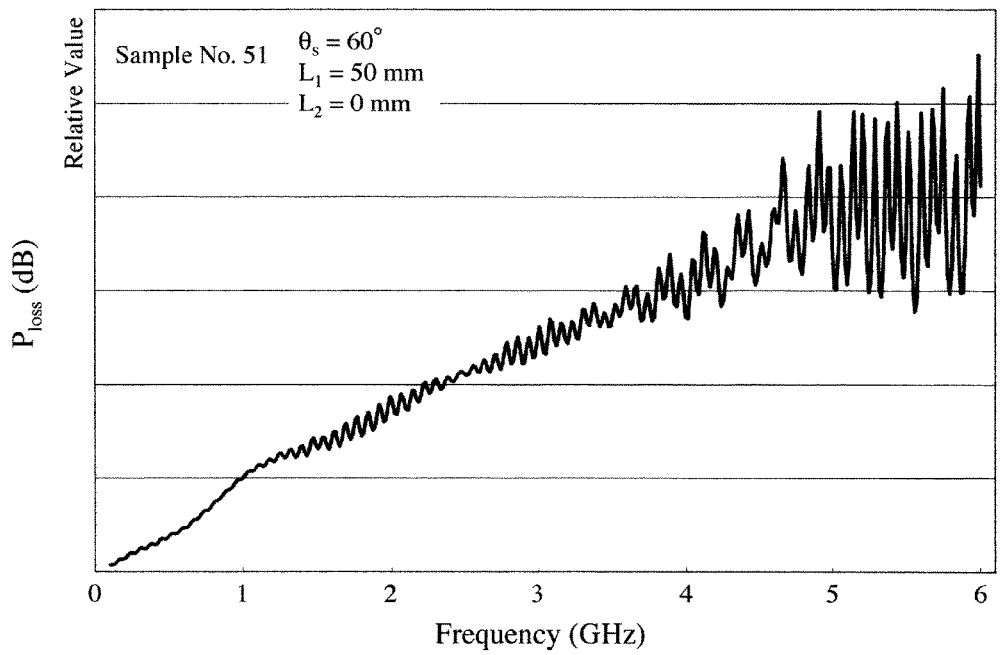
FIG. 38 is a graph showing the power loss $P_{loss}$ of Sample No. 51 of an electromagnetic-wave-absorbing filter ($L_2$=0 mm).
Figure 39:
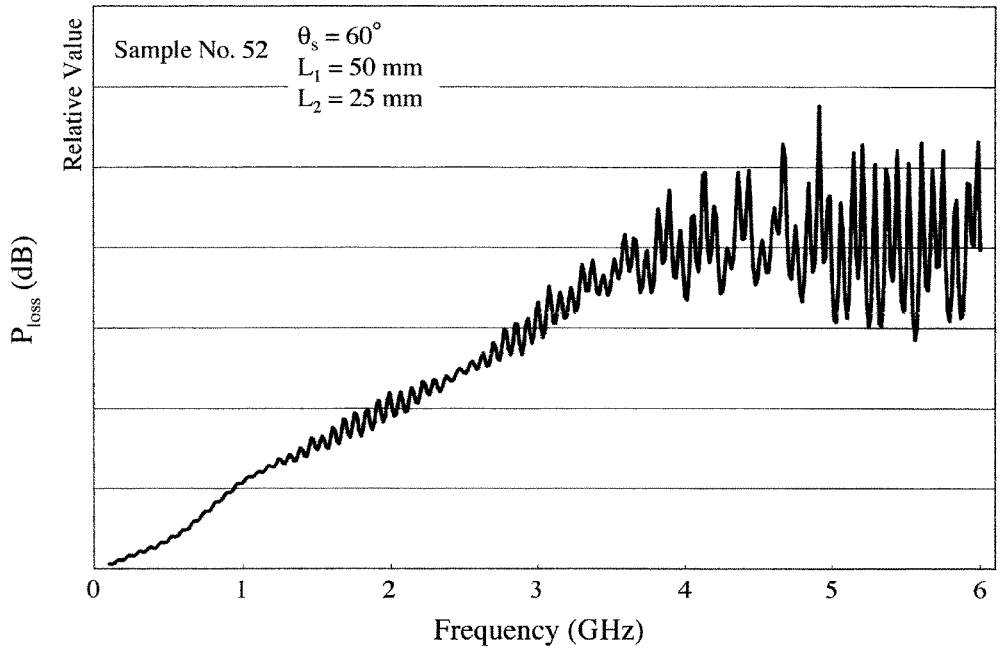
FIG. 39 is a graph showing the power loss $P_{loss}$ of Sample No. 52 of an electromagnetic-wave-absorbing filter ($L_2$=25 mm).
Figure 40:
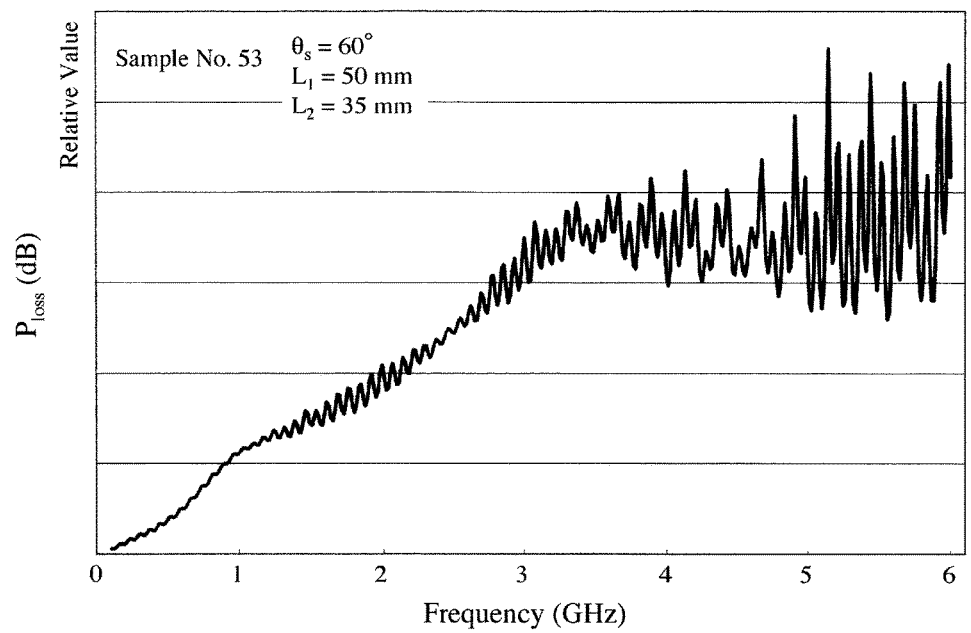
FIG. 40 is a graph showing the power loss $P_{loss}$ of Sample No. 53 of an electromagnetic-wave-absorbing filter ($L_2$=35 mm).
Figure 41:
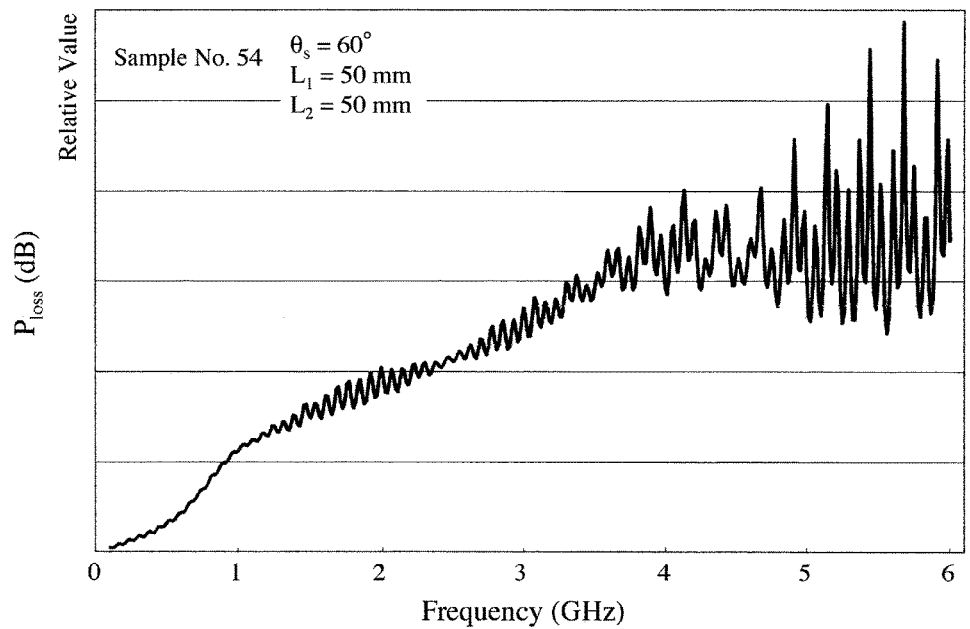
FIG. 41 is a graph showing the power loss $P_{loss}$ of Sample No. 54 of an electromagnetic-wave-absorbing filter ($L_2$=50 mm).
Figure 42:
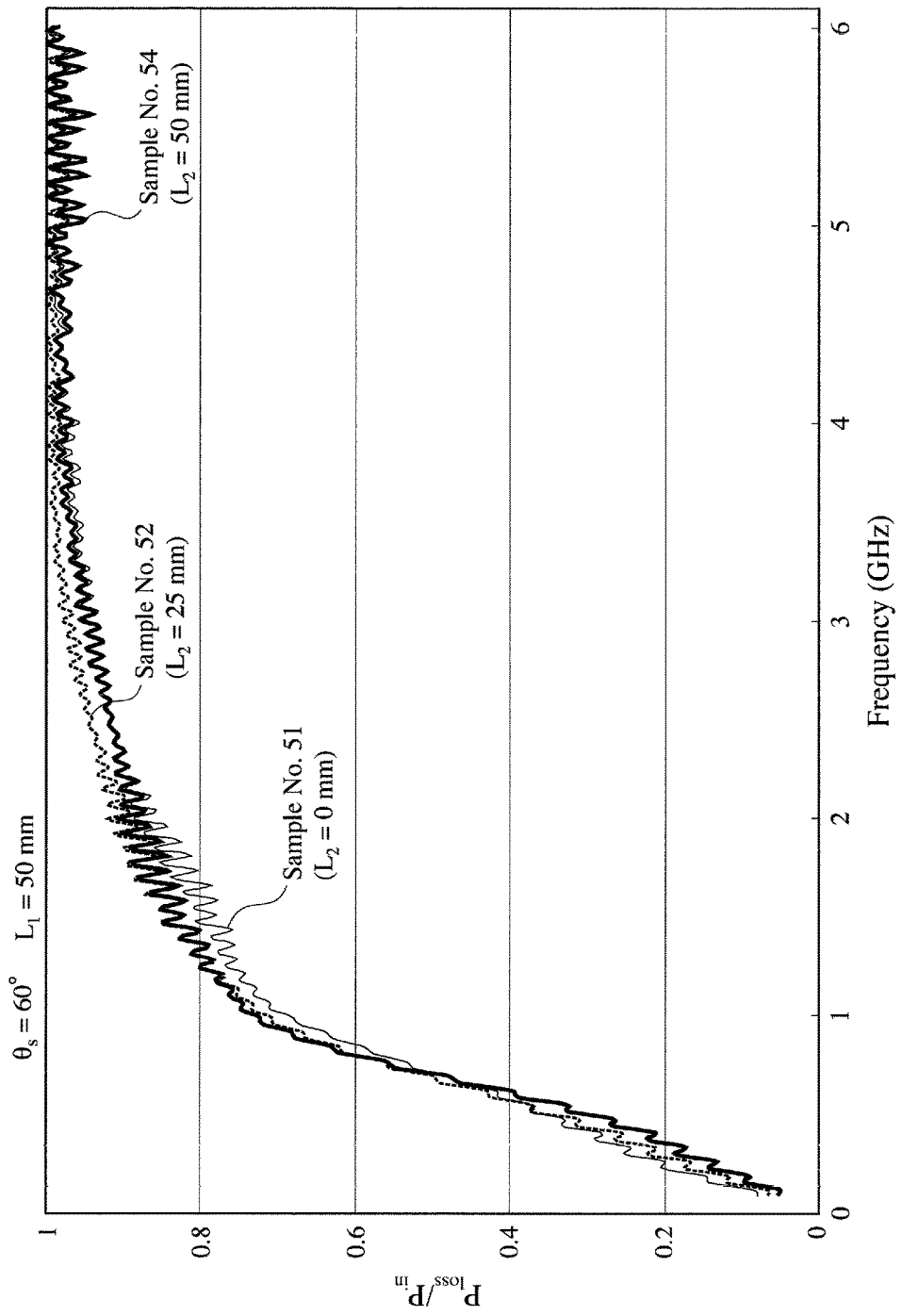
FIG. 42 is a graph showing the noise absorption ratios $P_{loss}/P_{in}$ of Samples No. 51, 52 and 54 of electromagnetic-wave-absorbing filters ($L_2$=0 mm, 25 mm and 50 mm).
Figure 43:
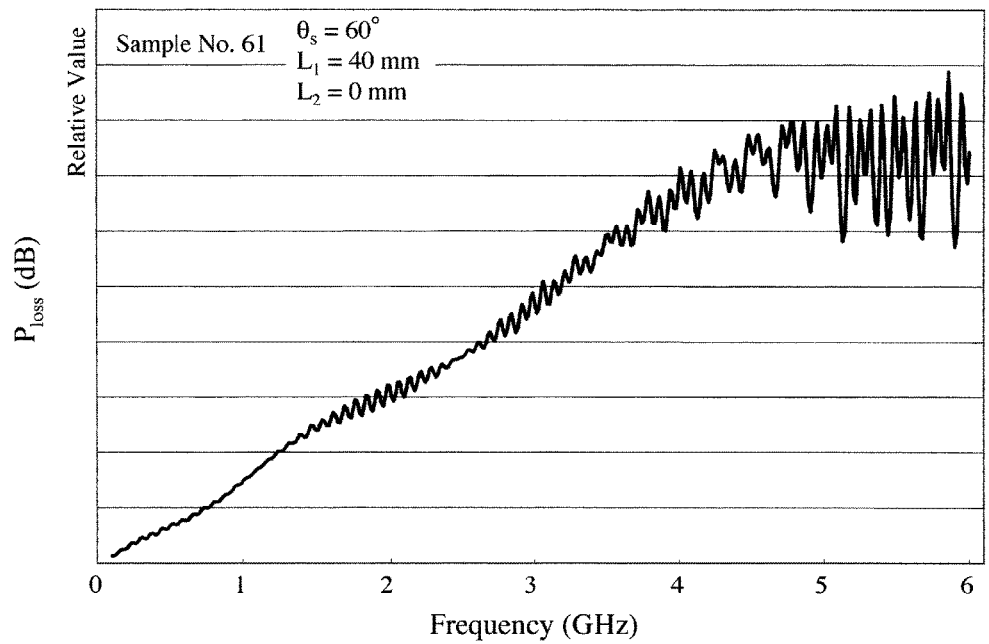
FIG. 43 is a graph showing the power loss $P_{loss}$ of Sample No. 61 of an electromagnetic-wave-absorbing filter ($L_2$=0 mm).
Figure 44:
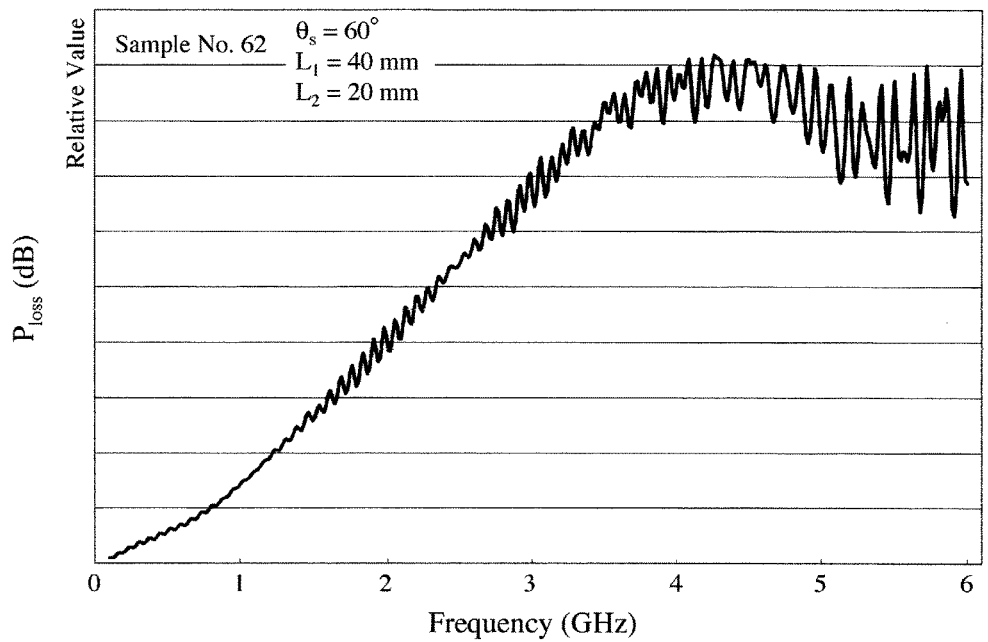
FIG. 44 is a graph showing the power loss $P_{loss}$ of Sample No. 62 of an electromagnetic-wave-absorbing filter ($L_2$=20 mm).
Figure 45:
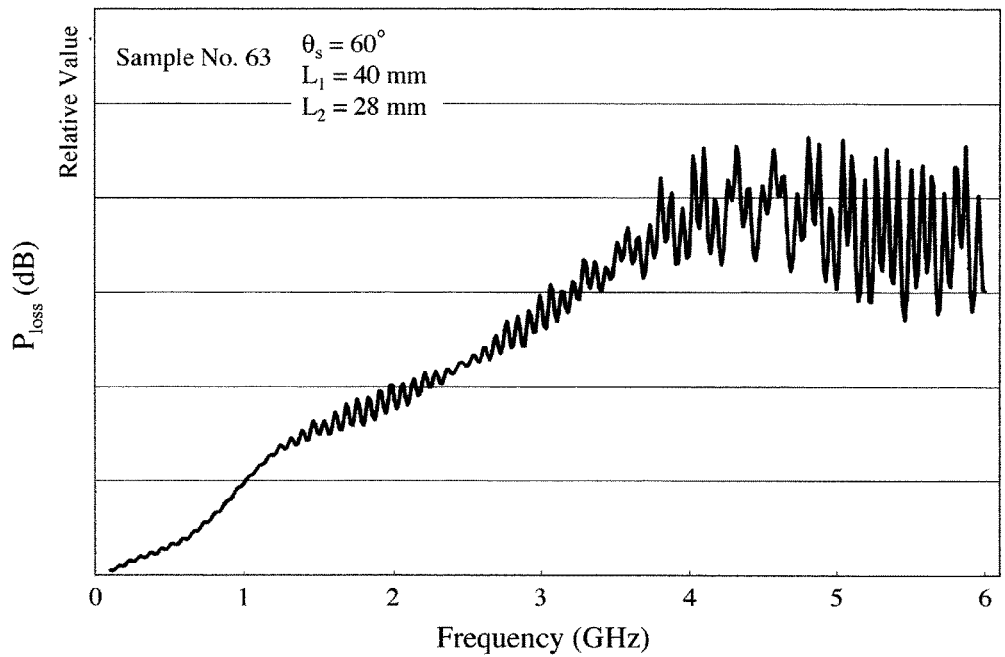
FIG. 45 is a graph showing the power loss $P_{loss}$ of Sample No. 63 of an electromagnetic-wave-absorbing filter ($L_2$=28 mm).
Figure 46:
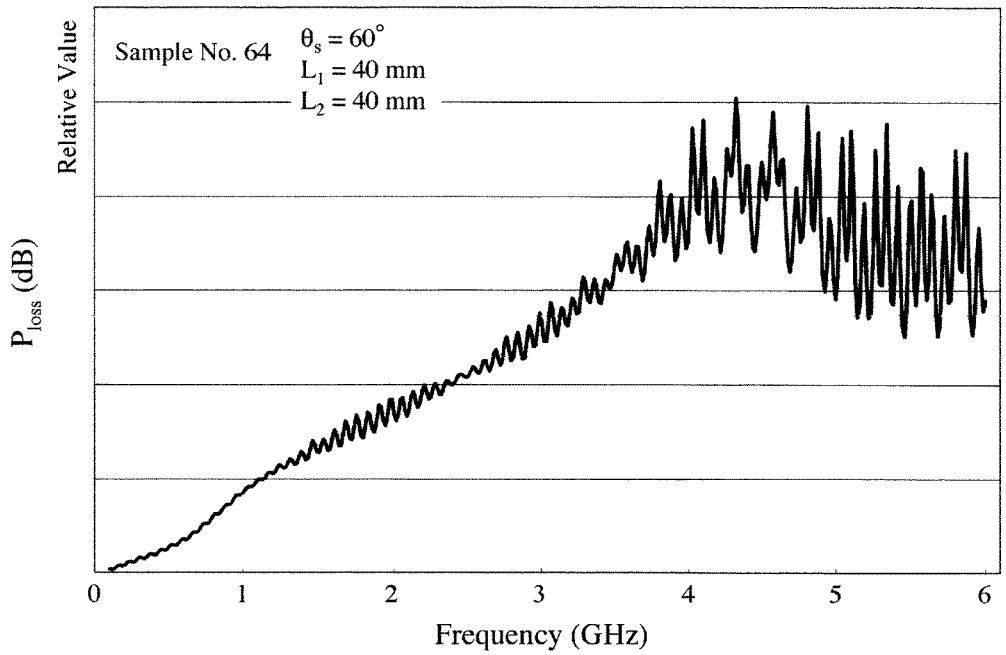
FIG. 46 is a graph showing the power loss $P_{loss}$ of Sample No. 64 of an electromagnetic-wave-absorbing filter ($L_2$=40 mm).
Figure 47:
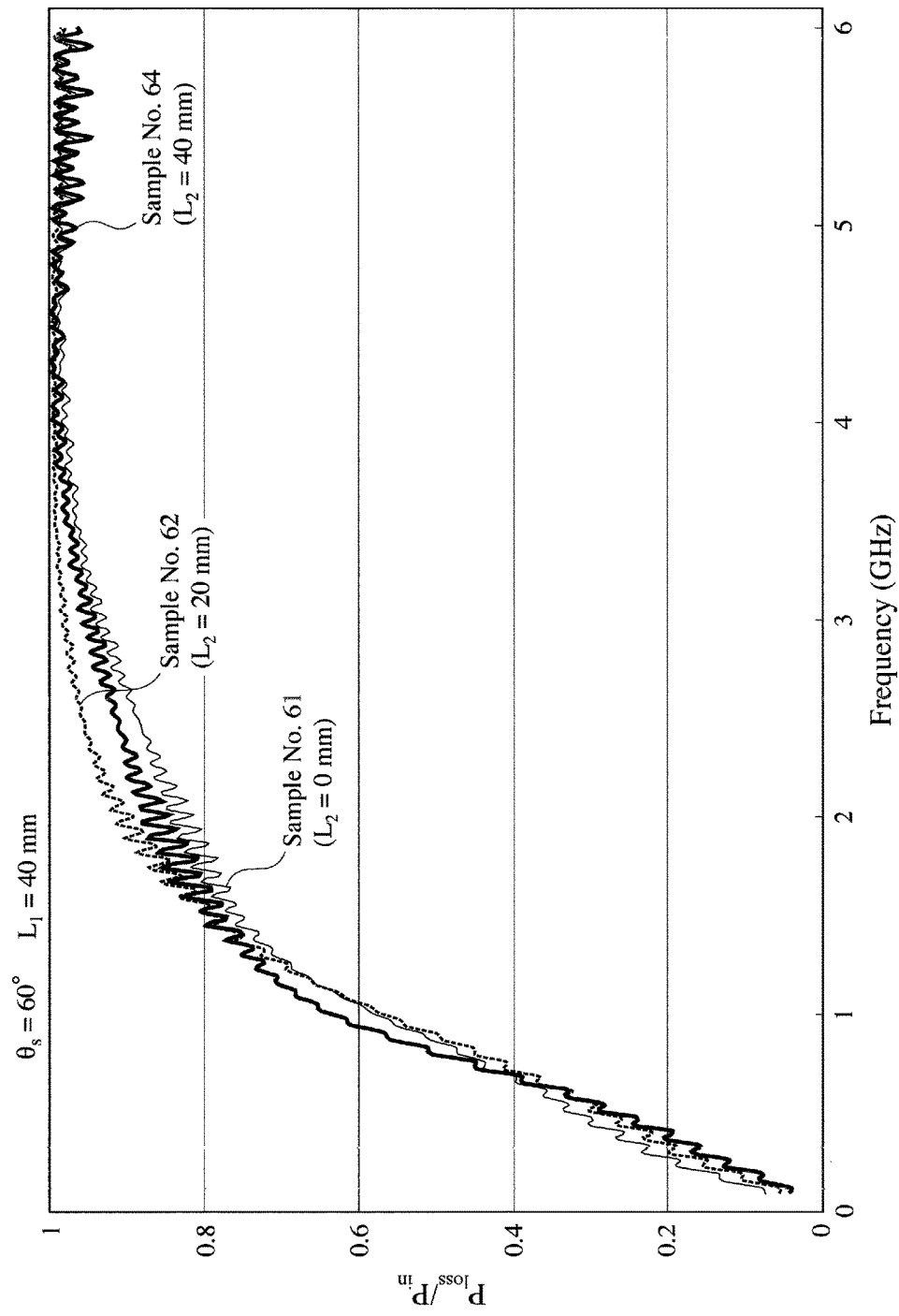
FIG. 47 is a graph showing the noise absorption ratios $P_{loss}/P_{in}$ of Samples No. 61, 62 and 64 of electromagnetic-wave-absorbing filters ($L_2$=0 mm, 20 mm and 40 mm).

In a system comprising a microstripline MSL (64.4 mm×4.4 mm) of 50Ω, an insulation substrate 300 supporting the microstripline MSL, a grounded electrode 301 attached to a lower surface of the insulation substrate 300, conductor pins 302, 302 connected to both edges of the microstripline MSL, a network analyzer NA, and coaxial cables 303, 303 for connecting the network analyzer NA to the conductor pins 302, 302 as shown in FIGS. 11(a) and 11(b), each electromagnetic-wave-absorbing filter sample Fs was attached to an upper surface of the insulating substrate 300 including the microstripline MSL by an adhesive, to measure reflected wave power $S_{11}$ and transmitted wave power $S_{12}$ with incident waves of 0.1-6 GHz.

Power loss $P_{loss}$ was determined by subtracting the reflected wave power $S_{11}$ and the transmitted wave power $S_{12}$ from the incident power $P_{in}$ input to the system shown in FIGS. 11(a) and 11(b), and a noise absorption ratio $P_{loss}/P_{in}$ was determined by dividing $P_{loss}$ by the incident power $P_{in}$. The results are shown in FIGS. 12-19.

As is clear from FIGS. 12-19, electromagnetic wave absorbability was higher at the $L_2/L_1$ ratio (ratio of the length $L_2$ of a shorter electromagnetic-wave-absorbing film 112 to the length $L_1$ of a longer electromagnetic-wave-absorbing film 111) in a range of 30-70%, than at the $L_2/L_1$ ratio of 0% (the electromagnetic-wave-absorbing layer was constituted by one electromagnetic-wave-absorbing film), and at the $L_2/L_1$ ratio of 100% (two electromagnetic-wave-absorbing films had the same length).

Example 2

First electromagnetic-wave-absorbing film pieces 111 having sizes of $L_1$ (=100) mm×50 mm, and second electromagnetic-wave-absorbing film pieces 112 having sizes of $L_2$ mm×50 mm were cut out of the electromagnetic-wave-absorbing film obtained in Reference Example 2, which had linear scratches with a crossing angle θs of 60°. $L_2$ were 0 mm, 30 mm, 40 mm, 50 mm, 60 mm, 70 mm, and 100 mm, respectively. The cutting directions of two electromagnetic-wave-absorbing film pieces were set, such that when two electromagnetic-wave-absorbing film pieces were overlapped with their lateral ends aligned, the minimum crossing angle α of their linear scratches was 30°. Using the first and second electromagnetic-wave-absorbing film pieces 111, 112 thus obtained, electromagnetic-wave-absorbing filter samples Fs were produced in the same manner as in Example 1. A combination of the first and second electromagnetic-wave-absorbing film pieces 111, 112 in each electromagnetic-wave-absorbing filter sample Fs is shown in Table 2.

TABLE 2

| Sample No. | Electromagnetic-Wave-Absorbing Film Piece | | | |
|---|---|---|---|---|
| | θs (°) | $L_1$ (mm) | $L_2$ (mm) | $L_2/L_1$ Ratio (%) |
| 21* | 60 | 100 | 0 | 0 |
| 22 | 60 | 100 | 30 | 30 |
| 23 | 60 | 100 | 40 | 40 |
| 24 | 60 | 100 | 50 | 50 |
| 25 | 60 | 100 | 60 | 60 |
| 26 | 60 | 100 | 70 | 70 |
| 27* | 60 | 100 | 100 | 100 |

Note:
Samples with * are Comparative Examples.

The power loss $P_{loss}$ and noise absorption ratio $P_{loss}/P_{in}$ of each electromagnetic-wave-absorbing filter sample Fs were determined by the same method as in Example 1. The results are shown in FIGS. 20-27. As is clear from FIGS. 20-27, in a case where the acute crossing angle θs in each electromagnetic-wave-absorbing film was 60°, too, electromagnetic wave absorbability was higher at the $L_2/L_1$ ratios in a range of 30-70% than at the $L_2/L_1$ ratios of 0% and 100%.

Example 3

Electromagnetic-wave-absorbing filter samples Fs were produced in the same manner as in Example 1, except that in first and second electromagnetic-wave-absorbing film pieces 111, 112 cut out of the electromagnetic-wave-absorbing film obtained in Reference Example 1, which had linear scratches with a crossing angle θs of 45°, $L_1$ was 50 mm, and $L_2$ were 0 mm, 25 mm, 35 mm, and 50 mm, respectively. A combination of the first and second electromagnetic-wave-absorbing film pieces 111, 112 in each electromagnetic-wave-absorbing filter sample Fs is shown in Table 3.

TABLE 3

| Sample No. | Electromagnetic-Wave-Absorbing Film Piece | | | |
|---|---|---|---|---|
| | θs (°) | $L_1$ (mm) | $L_2$ (mm) | $L_2/L_1$ Ratio (%) |
| 31* | 45 | 50 | 0 | 0 |
| 32 | 45 | 50 | 25 | 50 |
| 33 | 45 | 50 | 35 | 70 |
| 34* | 45 | 50 | 50 | 100 |

Note:
Samples with * are Comparative Examples.

With each electromagnetic-wave-absorbing filter sample Fs attached to an upper surface of the insulating substrate 300 including the microstripline MSL longitudinally symmetrically by an adhesive, the power loss $P_{loss}$ and the noise absorption ratio $P_{loss}/P_{in}$ were determined by the same method as in Example 1. The results are shown in FIGS. 28-32. As is clear from FIGS. 28-32, electromagnetic wave absorbability was higher at the $L_2/L_1$ ratios in a range of 50-70% than at the $L_2/L_1$ ratios of 0% and 100%.

Example 4

Electromagnetic-wave-absorbing filter samples Fs were produced in the same manner as in Example 1, except that in first and second electromagnetic-wave-absorbing film pieces 111, 112 cut out of the electromagnetic-wave-absorbing film obtained in Reference Example 1, which had linear scratches with a crossing angle θs of 45°, $L_1$ was 40 mm, and $L_2$ were 0 mm, 20 mm, 28 mm, and 40 mm, respectively. A combination of the first and second electromagnetic-wave-absorbing film pieces 111, 112 in each electromagnetic-wave-absorbing filter sample Fs is shown in Table 4.

TABLE 4

| Sample No. | Electromagnetic-Wave-Absorbing Film Piece | | | |
|---|---|---|---|---|
| | θs (°) | $L_1$ (mm) | $L_2$ (mm) | $L_2/L_1$ Ratio (%) |
| 41* | 45 | 40 | 0 | 0 |
| 42 | 45 | 40 | 20 | 50 |
| 43 | 45 | 40 | 28 | 70 |
| 44* | 45 | 40 | 40 | 100 |

Note:
Samples with * are Comparative Examples.

With each electromagnetic-wave-absorbing filter sample Fs attached to an upper surface of the insulating substrate 300 including the microstripline MSL longitudinally symmetrically by an adhesive, the power loss $P_{loss}$ and the noise absorption ratio $P_{loss}/P_{in}$ were determined by the same method as in Example 1. The results are shown in FIGS. 33-37. As is clear from FIGS. 33-37, electromagnetic wave absorbability was higher at the $L_2/L_1$ ratios in a range of 50-70% than at the $L_2/L_1$ ratios of 0% and 100%.

Example 5

Electromagnetic-wave-absorbing filter samples Fs were produced in the same manner as in Example 1, except that in first and second electromagnetic-wave-absorbing film pieces 111, 112 cut out of the electromagnetic-wave-absorbing film obtained in Reference Example 2, which had linear scratches with crossing angle θs of 60°, $L_1$ was 50 mm, and $L_2$ were 0 mm, 25 mm, 35 mm, and 50 mm, respectively. A combination of the first and second electromagnetic-wave-absorbing film pieces 111, 112 in each electromagnetic-wave-absorbing filter sample Fs is shown in Table 5.

TABLE 5

| Sample No. | Electromagnetic-Wave-Absorbing Film Piece | | | |
|---|---|---|---|---|
| | θs (°) | $L_1$ (mm) | $L_2$ (mm) | $L_2/L_1$ Ratio (%) |
| 51* | 60 | 50 | 0 | 0 |
| 52 | 60 | 50 | 25 | 50 |
| 53 | 60 | 50 | 35 | 70 |
| 54* | 60 | 50 | 50 | 100 |

Note:
Samples with * are Comparative Examples.

With each electromagnetic-wave-absorbing filter sample Fs attached to an upper surface of the insulating substrate 300 including the microstripline MSL longitudinally symmetrically by an adhesive, the power loss $P_{loss}$ and the noise absorption ratio $P_{loss}/P_{in}$ were determined by the same method as in Example 1. The results are shown in FIGS. 38-42. As is clear from FIGS. 38-42, electromagnetic wave absorbability was higher at the $L_2/L_1$ ratios in a range of 50-70% than at the $L_2/L_1$ ratios of 0% and 100%.

Example 6

Electromagnetic-wave-absorbing filter samples Fs were produced in the same manner as in Example 1, except that in first and second electromagnetic-wave-absorbing film pieces 111, 112 cut out of the electromagnetic-wave-absorbing film obtained in Reference Example 2, which had linear scratches with a crossing angle θs of 60°, $L_1$ was 40 mm, and $L_2$ were 0 mm, 20 mm, 28 mm, and 40 mm, respectively. A combination of the first and second electromagnetic-wave-absorbing film pieces 111, 112 in each electromagnetic-wave-absorbing filter sample Fs is shown in Table 6.

TABLE 6

| Sample No. | Electromagnetic-Wave-Absorbing Film Piece | | | |
|---|---|---|---|---|
| | θs (°) | $L_1$ (mm) | $L_2$ (mm) | $L_2/L_1$ Ratio (%) |
| 61* | 60 | 40 | 0 | 0 |
| 62 | 60 | 40 | 20 | 50 |
| 63 | 60 | 40 | 28 | 70 |
| 64* | 60 | 40 | 40 | 100 |

Note:
Samples with * are Comparative Examples.

With each electromagnetic-wave-absorbing filter sample Fs attached to an upper surface of the insulating substrate 300 including the microstripline MSL longitudinally symmetrically by an adhesive, the power loss $P_{loss}$ and the noise absorption ratio $P_{loss}/P_{in}$ were determined by the same method as in Example 1. The results are shown in FIGS. 43-47. As is clear from FIGS. 43-47, electromagnetic wave absorbability was higher at the $L_2/L_1$ ratios in a range of 50-70% than at the $L_2/L_1$ ratios of 0% and 100%.

EFFECTS OF THE INVENTION

Because the electromagnetic-wave-absorbing filter of the present invention having the above structure has excellent electromagnetic wave absorbability, it can effectively suppress the radiation of electromagnetic waves from a conductor cable and the intrusion of electromagnetic waves into a conductor cable. Also, because the electromagnetic-waveabsorbing filter of the present invention comprises two thin electromagnetic-wave-absorbing films, an insulating layer, and a thin electromagnetic-wave-shielding layer, it can easily be made thinner at lower cost. The electromagnetic-wave-absorbing filter of the present invention having such a structure can easily be attached to cables for transmitting signals of various frequencies, and power cables connected to various electric appliances and electronic appliances acting as noise sources.

DESCRIPTION OF REFERENCE NUMERALS

10: Electromagnetic-wave-absorbing filter
110: Electromagnetic-wave-absorbing layer
111, 112: Electromagnetic-wave-absorbing film
111a, 112a: Plastic film
111b, 112b: Thin metal film
113, 113a, 113b: Linear scratch
120: Insulating layer
130: Electromagnetic-wave-shielding layer
131: Composite film
132: Ground line
140: Adhesive layer
150: Adhesive film
20: Conductor cable
21: Conductive core cable
22: Inner insulating sheath
23: Outer insulating sheath
200: Composite film of thin metal film and plastic film
202a, 202b, 232a, 232b: Pattern roll
203a, 203b, 233a, 233b: Push roll
204a, 204b, 234a, 234b: Electric-resistance-measuring means (roll)
205a, 205b, 235a: Backup roll
221, 224: Reel
222, 223: Guide roll
300: Insulating substrate
301: Grounded electrode
302: Conductor pin
303: Coaxial cable
D: End-to-end distance of two electromagnetic-wave-absorbing films
Fs: Electromagnetic-wave-absorbing filter sample
$L_1$: Length of one electromagnetic-wave-absorbing film
$L_2$: Length of the other electromagnetic-wave-absorbing film
MSL: Microstripline
NA: Network analyzer
α: Minimum crossing angle of linear scratches in two electromagnetic-wave-absorbing films
β: Inclination angle of linear scratches to conductor cable
θs: Crossing angle of linear scratches in each electromagnetic-wave-absorbing film
Ls: Length of linear scratch
W: Width of linear scratch
I: Interval of linear scratches

What is claimed is:

1. An electromagnetic-wave-absorbing filter to be wound around a conductor cable, comprising an electromagnetic-wave-absorbing layer, an insulating layer, and an electromagnetic-wave-shielding layer in this order from inside;
said electromagnetic-wave-absorbing layer being constituted by a laminate of at least two electromagnetic-wave-absorbing films;
each of said electromagnetic-wave-absorbing films comprising a single- or multi-layer thin metal film formed on a surface of a plastic film, said thin metal film being provided with pluralities of substantially parallel, intermittent, linear scratches with irregular widths and intervals in plural directions;
said linear scratches in each of said electromagnetic-wave-absorbing films having an acute crossing angle θs in a range of 30-90°;
the linear scratches in one electromagnetic-wave-absorbing film being crossing the linear scratches in the other electromagnetic-wave-absorbing film;
said two electromagnetic-wave-absorbing films having different lengths in a longitudinal direction of said conductor cable; and
an $L_2/L_1$ ratio, wherein $L_1$ is the length of a longer electromagnetic-wave-absorbing film, and $L_2$ is the length of a shorter electromagnetic-wave-absorbing film, being 30-70%.

2. The electromagnetic-wave-absorbing filter according to claim 1, wherein the minimum crossing angle α between the linear scratches in one electromagnetic-wave-absorbing film and the linear scratches in the other electromagnetic-wave-absorbing film is 10-45°.

3. The electromagnetic-wave-absorbing filter according to claim 1, wherein said linear scratches in each of said electromagnetic-wave-absorbing films have widths in a range of 0.1-100 μm for 90% or more and 1-50 μm on average, and lateral intervals in a range of 1-500 μm and 10-100 μm on average.

4. The electromagnetic-wave-absorbing filter according to claim 1, wherein said insulating layer is made of a thermoplastic resin or rubber.

5. The electromagnetic-wave-absorbing filter according to claim 1, wherein said insulating layer contains insulating magnetic particles.

6. The electromagnetic-wave-absorbing filter according to claim 5, wherein said insulating layer is as thick as 0.5 mm or more.

7. The electromagnetic-wave-absorbing filter according to claim 1, wherein said electromagnetic-wave-shielding layer is constituted by a plastic film, and a single- or multi-layer thin metal film formed on a surface of said plastic film.

8. The electromagnetic-wave-absorbing filter according to claim 7, wherein said thin metal film in said electromagnetic-wave-shielding layer is made of at least one metal selected from the group consisting of aluminum, copper, silver, tin, nickel, cobalt, chromium and their alloys.

9. The electromagnetic-wave-absorbing filter according to claim 8, wherein said thin metal film in said electromagnetic-wave-shielding layer is vapor-deposited.

10. The electromagnetic-wave-absorbing filter according to claim 1, wherein a ground line is attached to said electromagnetic-wave-shielding layer.

* * * * *